(12) United States Patent
Hornbeck

(10) Patent No.: US 8,891,149 B2
(45) Date of Patent: Nov. 18, 2014

(54) MICROELECTROMECHANICAL SYSTEM (MEMS) DEVICES WITH DIELECTRIC MICROSTRUCTURE MOTION STOPPER

(71) Applicant: Texas Instruments Incorporated, Dallas, TX (US)

(72) Inventor: Larry J. Hornbeck, Van Alstyne, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/023,101

(22) Filed: Sep. 10, 2013

(65) Prior Publication Data

US 2014/0016171 A1    Jan. 16, 2014

Related U.S. Application Data

(62) Division of application No. 12/344,526, filed on Dec. 28, 2008, now Pat. No. 8,531,759.

(60) Provisional application No. 61/017,540, filed on Dec. 29, 2007.

(51) Int. Cl.
| | | |
|---|---|---|
| G02B 26/08 | (2006.01) | |
| B81B 7/00 | (2006.01) | |
| B81B 3/00 | (2006.01) | |
| B29C 33/38 | (2006.01) | |

(52) U.S. Cl.
CPC ............ *B81B 7/0003* (2013.01); *B81B 3/0081* (2013.01); *B81B 3/0086* (2013.01); *G02B 26/0841* (2013.01); *B29C 33/38* (2013.01); *G02B 26/08* (2013.01)
USPC .................. 359/224.1; 359/199.2; 359/200.6; 359/298

(58) Field of Classification Search
CPC .... G02B 26/08; G02B 26/0841; B29C 33/38; B81B 3/0081; B81B 3/0086; B81B 7/0003; B81B 7/02
USPC .................... 359/224.1–224.2, 291, 295, 298
See application file for complete search history.

(56) References Cited

U.S. PATENT DOCUMENTS

| | | | |
|---|---|---|---|
| 6,802,754 B2 | 10/2004 | Chiu et al. | |
| 7,176,492 B2 | 2/2007 | Chiu | |
| 2005/0110138 A1 | 5/2005 | Dutt | |
| 2008/0206994 A1 | 8/2008 | Feustel et al. | |

*Primary Examiner* — James Phan
(74) *Attorney, Agent, or Firm* — Jacqueline J. Garner; Frederick J. Telecky, Jr.

(57) ABSTRACT

Disclosed herein is a dielectric microstructure with a substantially unit dielectric constant K for use in microelectromechanical systems.

26 Claims, 34 Drawing Sheets

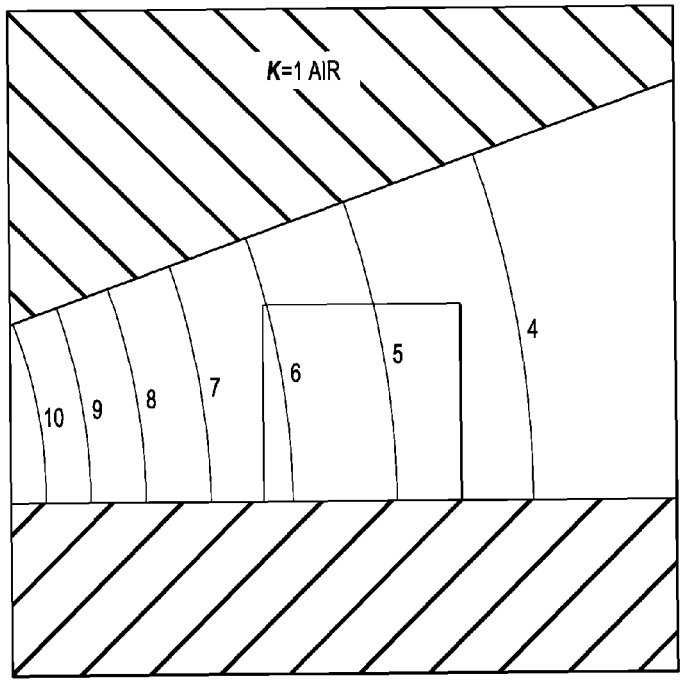
FIG. 2b
FIG. 2c
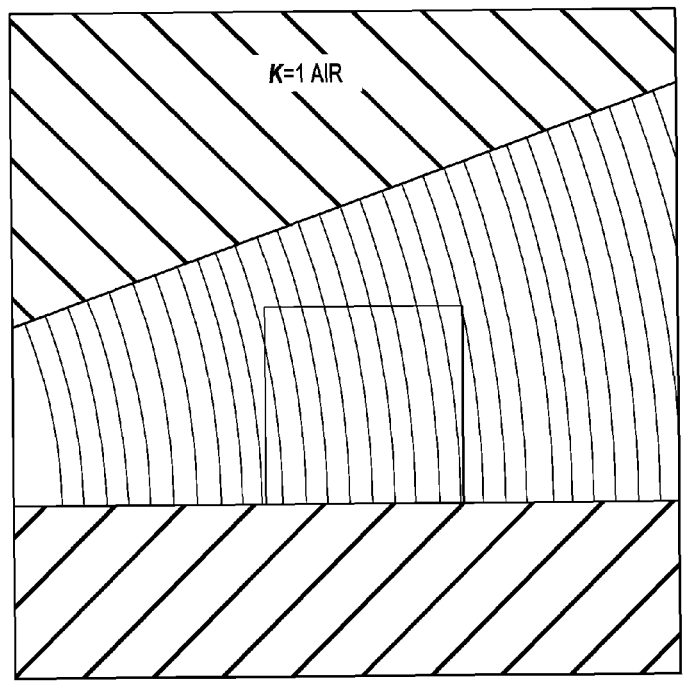

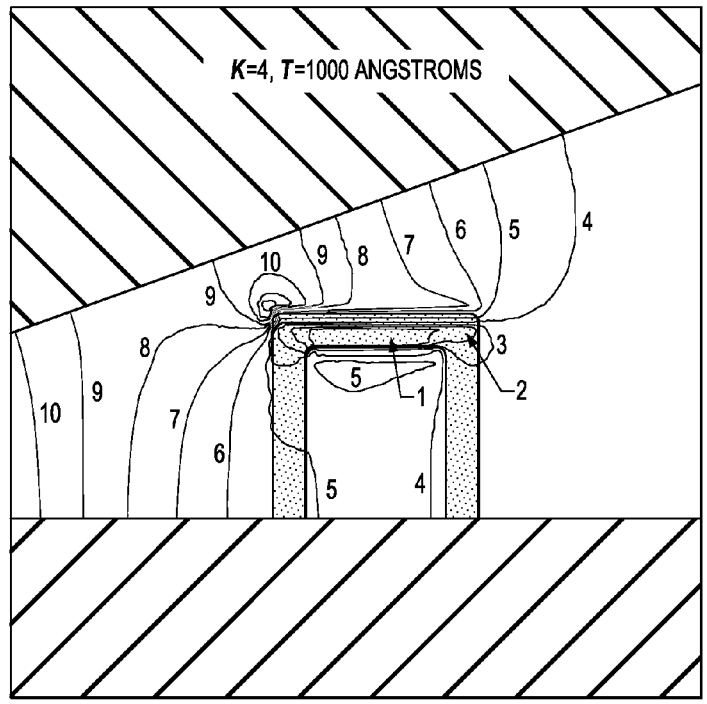
FIG. 2f
FIG. 2g
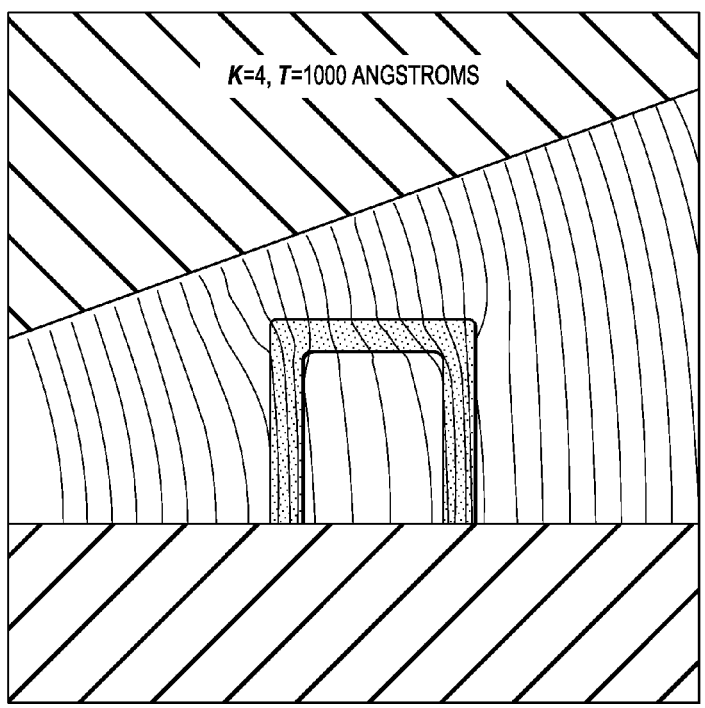

US 8,891,149 B2

MICROELECTROMECHANICAL SYSTEM (MEMS) DEVICES WITH DIELECTRIC MICROSTRUCTURE MOTION STOPPER

This application is a division of application Ser. No. 12/344,526, filed Dec. 28, 2008 (now U.S. Pat. No. 8,531,759), which claims the benefit of Provisional Application No. 61/017,540 filed Dec. 29, 2007, the entireties of both of which are incorporated herein by reference.

BACKGROUND

This relates to microstructures and, more particularly, to dielectric microstructures for use in microelectromechanical system (MEMS) devices.

In most current microelectromechanical system (MEMS) devices, which are a type of microstructure devices, dielectric materials or structures composed of dielectric materials (dielectric structure) often exhibit non-unit dielectric constants K, except air. When a microelectromechanical system having a dielectric material or a dielectric structure is exposed to electric field, the dielectric material or dielectric structure may block the electric field by terminating the electric field lines in the vicinity of surfaces of dielectric material or dielectric structure—resulting in unwanted electric charge accumulation; and electrical field gradients. Unwanted electric charge and/or electrical field gradients may significantly degrade performance of MEMS devices; and in some situations, may cause device failure.

Some of MEMS devices, such as microbolometers desire mechanical supports with low thermal conductance. However, existing techniques do not provide satisfactory solutions for such mechanical supports.

Therefore, what is desired is a dielectric structure exhibiting substantially a unit dielectric constant K in electrical fields, and/or low thermal conductance.

SUMMARY

In one example, a device is provided. The device comprises: a dielectric microstructure with a substantially unit dielectric constant, wherein the dielectric microstructure has a characteristic dimension of 50 microns or less.

In another example, a device is provided. The device comprises: a dielectric microstructure with a substantially unit dielectric constant, comprising: an interior portion surrounded by an outer shell that comprises a dielectric material.

In yet another example, a device is provided. The device comprises: a solid-state dielectric microstructure with a substantially unit dielectric constant.

In yet another example, a micromirror device is provided. The device comprises: a substrate; a deformable hinge held above the substrate; a reflective mirror plate attached to the deformable hinge such that the mirror plate is capable of moving above the substrate; and an elevated addressing electrode elevated above the substrate for moving the mirror plate, further comprising: a spring stopper substantially in the same plane as the elevated addressing electrode; and a dielectric microstructure formed on the spring stopper.

In yet another example, a method is provided. The method comprises: providing a substrate; forming a mold comprising a first material on the substrate; converting an outer layer of the mold into a second material that is different from the first material; removing an interior portion that is surrounded by the outer layer of the mold so as to form a dielectric microstructure with the outer layer and a hollow interior portion; and wherein the outer layer has a thickness such that the formed dielectric microstructure has a substantially unit dielectric constant.

BRIEF DESCRIPTION OF DRAWINGS

FIGS. 2a through 2n show a theoretical model of electric field distribution across an exemplary dielectric microstructure disposed in the electric field, wherein:

FIG. 2a diagrammatically illustrates a region having an exemplary dielectric microstructure disposed between top and bottom electrodes, across which an electric field is established;

FIG. 2b shows electric field contours in the region, wherein the dielectric microstructure has a unit dielectric constant;

FIG. 2c is a diagram showing electric field lines in the region, wherein the dielectric microstructure has a unit dielectric constant;

FIG. 2f shows electric field contours in the region, wherein the dielectric microstructure has a dielectric constant of 4; and the walls of the dielectric microstructure have a thickness of 1000 angstroms;

FIG. 2g is a diagram showing electric field lines in the region, wherein the dielectric microstructure has a unit dielectric constant; and the walls of the dielectric microstructure has a thickness of 1000 angstroms;

FIG. 2n shows the normalized electric field at the contact corner of the dielectric microstructure vs. the thickness of the sidewalls of the dielectric microstructure.

FIG. 23b schematically illustrates a top view of the stopping portion of the micromirror device in FIG. 23a;

FIG. 25 schematically illustrates an exemplary display system employing an array of micromirror devices in FIG. 23a;

DETAILED DESCRIPTION OF SELECTED EXAMPLES

Disclosed herein is a dielectric microstructure with substantially unit dielectric constant K and a method of forming the same. The dielectric microstructure comprises at least a dielectric material other than air; and the dielectric material is formed into a solid-structure. The dielectric microstructure exhibits a substantially unit dielectric constant K in electric fields; and can be especially useful in microelectromechanical systems (hereafter, "MEMS", "MEMS device", or "MEMS devices").

In the following, the method will be discussed with reference to selected examples. However, it will be appreciated by those skilled in that art that the following discussion is for demonstration purpose, and should not be interpreted as a limitation. Other variations within the scope of the disclosure are also applicable.

Figure 1:
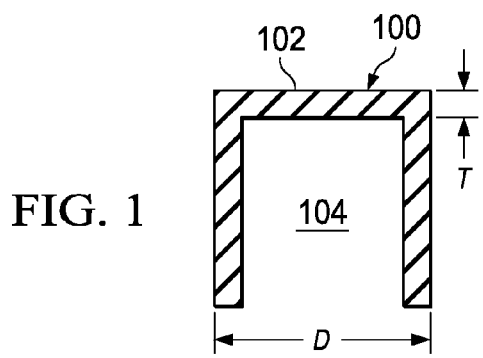
FIG. 1 schematically illustrates a cross-sectional view of an exemplary dielectric microstructure having a dielectric constant of substantially unity-K.

Referring to the drawings, FIG. 1 schematically illustrates a cross-sectional view of an exemplary dielectric microstructure of this disclosure. In this example, dielectric microstructure 100 comprises a dielectric exterior shell (102) and an interior air space (104). The dielectric microstructure (100) has a characteristic dimension D, such as a lateral dimension (e.g. width or length), wherein D is preferably 2000 microns or less, 1000 microns or less, 500 microns or less, 200 microns or less, 100 microns or less, 50 microns or less, 20 microns or less, 10 microns or less, 5 microns or less, 500 nanometers or less, 200 nanometers or less, and is preferably larger than 100 angstroms, depending upon the specific application of the dielectric microstructure. Of course, the dielectric microstructure may have other desired characteristic dimensions.

The exterior shell (102) of dielectric microstructure (100) may be comprised of any suitable dielectric materials, such as ceramics (e.g. oxides, nitrides, and oxy-nitrides) or other dielectric materials. The dielectric materials of the dielectric microstructure may have any suitable dielectric constants K. Exemplary dielectric materials of the dielectric microstructures can be $SiO_2$, $Si_3N_4$, $Al_2O_3$, and other materials. In specific MEMS devices, such as micromirror devices, selection of the dielectric material(s) for the dielectric structure may also include considerations of specific fabrication methods for the MEMS devices. For example, a sacrificial spacer material is often used in making a micromirror device. When the micromirror device is desired to comprise a dielectric microstructure, which will be detailed afterwards, the dielectric material is preferred to be inert to the sacrificial spacer ash.

The dielectric material(s) of the dielectric microstructure (100) can be in any suitable solid-state forms, such as solid-state with a long range order (e.g. a crystal form) or a state with short-range orders. The dielectric microstructure may be composed of crystalline materials, clusters, nano-structures, liquid-crystal structures, or other types of materials, or any combinations thereof The interior air space (104) can be filled (partially or fully) with any suitable materials, which are preferably air and/or other vapor/gaseous materials (e.g. $N_2$, noble gases such as He, Ar) or other materials, such as vapor/gaseous lubricant.

The dielectric microstructure (100) exhibits substantially unit-dielectric constant K in electric fields (hereafter unity-K). Specifically, even though the dielectric microstructure (100) may be comprised of a material having any suitable or desired dielectric constant, the dielectric microstructure exhibits an equivalent dielectric constant K that is 2.5 or less, such as 2 or less, 1.8 or less, 1.6 or less, 1.4 or less, 1.2 or less, 1.1 or less, and substantially equal to 1. The unity-K of the dielectric structure (100) can be accomplished by many possible ways, one of which is selecting the thickness T of the sidewall(s), especially the sidewalls intercepting the electric fields during application. For demonstration purposes, FIG. 2a through FIG. 2o demonstrate a quantitative analysis of electric fields across dielectric microstructures with different sidewall thicknesses.

Figure 2A:
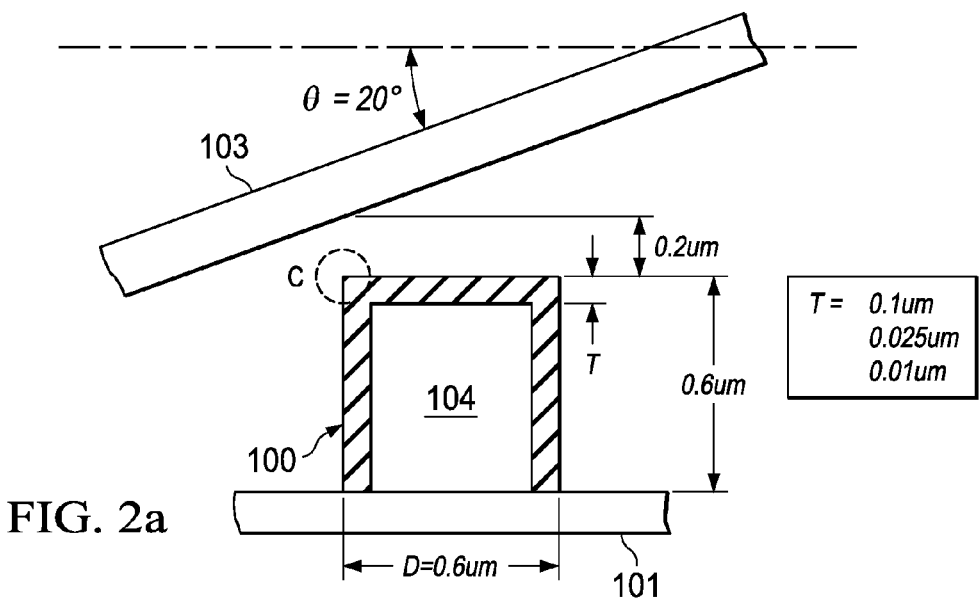

FIG. 2a shows an exemplary physical setup of the dielectric microstructure in an electric field. The dielectric microstructure (100) is disposed between the top electrode (103) and the bottom electrode (101); and is formed on the bottom electrode (101) such that the bottom surface of the dielectric microstructure is a portion of the top surface of the bottom electrode (101). The top and bottom electrodes are configured as an infinite or semi-infinite capacitor. The top electrode (103) is tilted by the angle θ, which is 20° counterclockwise in this setup.

The dielectric microstructure (100) is a cube with a dimension (length, width, and height) of 0.6 microns. The three major sidewalls (the two vertical sidewalls and top sidewall) have the identical thickness T, which is selected from the values of 0.1 micron, 0.025 micron, and 0.01 micron for the analysis.

The dielectric microstructure (100) and the top rotatable electrode (103) have a gap of 0.2 micron. The gap is measured as the distance between the contact point C of the dielectric microstructure (100) and the bottom surface of the top electrode (103) as shown in the figure. The electric field around the contact point C as the top electrode rotationally approaches the contact point is denoted as Ec. A voltage potential of 1 volt is applied across the top and bottom electrodes.

FIG. 2b shows the electric field contours in the vicinity of a unit K dielectric microstructure having a thickness of 0 (a virtual dielectric microstructure) and a dielectric constant 1 (a virtual air dielectric microstructure) and identical outer dimensions as the dielectric microstructure 100 as shown in FIG. 2a. Contours 4 and 10 respectively represent electric fields 0.95 V/um and 1.85 V/um. The electric field Ec at the contact point is 1.26 V/um. It is noted that the field contours inside the (virtual) dielectric microstructure are not deviated due to the unity-K. The field lines, as shown in FIG. 2c, inside the (virtual) dielectric microstructure are not deviated either due to the unity-K. FIG. 2b also provides a blowup of the field contours in the vicinity of the contact point.

Figure 2D:
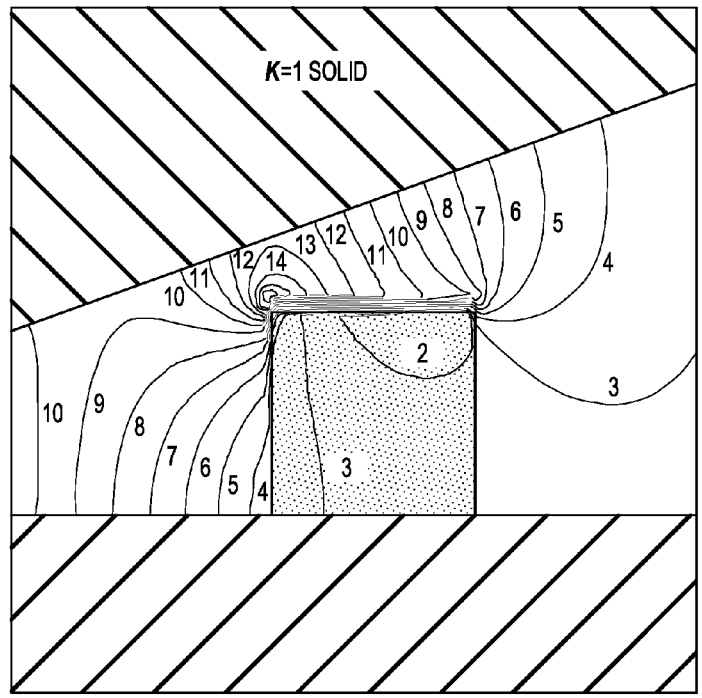
FIG. 2d shows electric field contours in the region, wherein the dielectric microstructure has a dielectric constant of 4; and the dielectric microstructure is a solid dielectric structure.
Figure 2E:
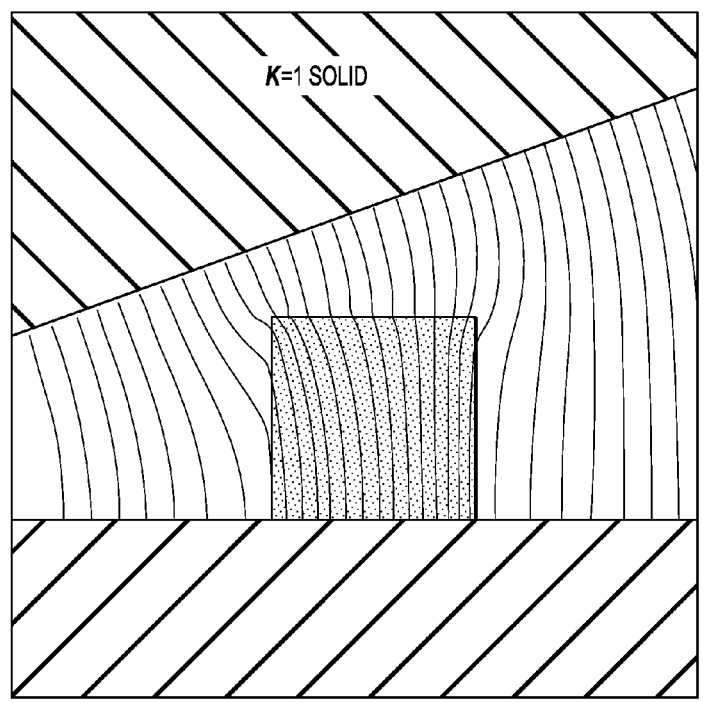
FIG. 2e is a diagram showing electric field lines in the region, wherein the dielectric microstructure has a unit dielectric constant; and the dielectric microstructure is a solid dielectric structure.

As comparison, FIG. 2d and FIG. 2e respectively show electric field contours and field lines in the vicinity of a dielectric microstructure that has a solid body (e.g. a thickness of 0.3 um, which is half the width of the dielectric microstructure) and dielectric constant K=4. Electric contours 3 and 14 respectively represent electric fields 0.80 V/um and 2.45 V/um. The electric field Ec at the contact point is 2.75 V/um. FIG. 2d also provides a blowup of the field contours in the vicinity of the contact point. The dashed line in the blowup represents the volumetric region about the contact point having a high electric field gradient.

It is noted that the field contours converge at the top surface of the solid dielectric microstructure, as such accumulate significant electric field gradient in the vicinity of the top surface of the dielectric microstructure. The electric field contours inside the solid dielectric microstructure are deviated from those in unity-K dielectric microstructure as shown in FIG. 2b. The field lines, as shown in FIG. 2e, inside the solid dielectric microstructure also are deviated from those in unity-K dielectric microstructure shown in FIG. 2c.

By reducing the thickness of the sidewalls of the dielectric microstructure, deviation of the electric field contours and field lines inside the body and in the vicinity of the dielectric microstructure can be reduced. In other words, the electric field in the vicinity and inside the body of the dielectric microstructure can be more close to those in air dielectric microstructure shown in FIG. 2b and FIG. 2c as the thickness of the sidewalls of the dielectric microstructure is reduced. For demonstration purposes, FIG. 2f through FIG. 2k show the electric field contours and electric field lines inside and in the vicinity of dielectric microstructures with reduced sidewall thicknesses.

FIG. 2f and FIG. 2g respectively show electric field contours and field lines in the vicinity of a dielectric microstructure whose sidewalls having a thickness of 1000 angstroms and dielectric constant K=4. Electric contours 4 and 10 respectively represent electric fields 0.95 V/um and 1.85 V/um. The electric field Ec at the contact point is 2.15 V/um. FIG. 2f also provides a blowup of the field contours in the vicinity of the contact point. The dashed line in the blowup represents the volumetric region about the contact point having a high electric field gradient.

It is noted that the electric field contours deviate from those in air dielectric microstructure shown in FIG. 2b, while the deviation is less than those in solid dielectric microstructure shown in FIG. 2d. The electric field lines deviate from those in air dielectric microstructure shown in FIG. 2c, while the deviation is less than those in solid dielectric microstructure shown in FIG. 2e.

Figure 2H:
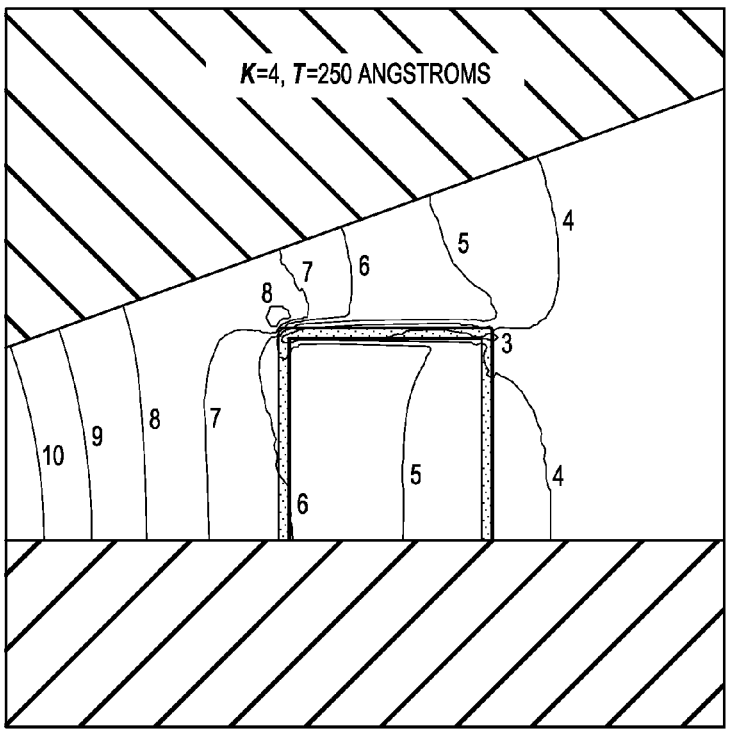
FIG. 2h shows electric field contours in the region, wherein the dielectric microstructure has a dielectric constant of 4; and the walls of the dielectric microstructure has a thickness of 250 angstroms.
Figure 2I:
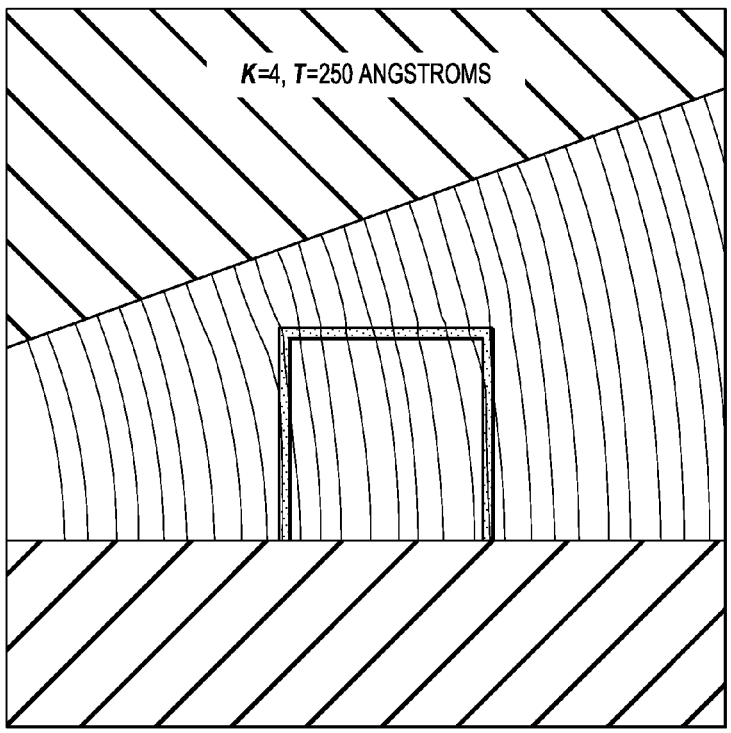
FIG. 2i is a diagram showing electric field lines in the region, wherein the dielectric microstructure has a unit dielectric constant; and the walls of the dielectric microstructure has a thickness of 250 angstroms.

FIG. 2h and FIG. 2i respectively show electric field contours and field lines in the vicinity of a dielectric microstructure whose sidewalls having a reduced thickness of 250 angstroms and dielectric constant K=4. Electric contours 3 and 10 respectively represent electric fields 0.80 V/um and 1.85

V/um. The electric field Ec at the contact point is 1.55 V/um. FIG. 2h also provides a blowup of the field contours in the vicinity of the contact point. The dashed line in the blowup represents the volumetric region about the contact point having a high electric field gradient.

It is noted that the electric field contours deviate from those in air dielectric microstructure shown in FIG. 2b, while the deviation is less than those in solid dielectric microstructure shown in FIG. 2d; and even less than those in dielectric microstructure shown in FIG. 2f. The electric field lines deviate from those in air dielectric microstructure shown in FIG. 2c, while the deviation is less than those in solid dielectric microstructure shown in FIG. 2e and is even less than those in dielectric microstructure shown in FIG. 2g.

Figure 2J:
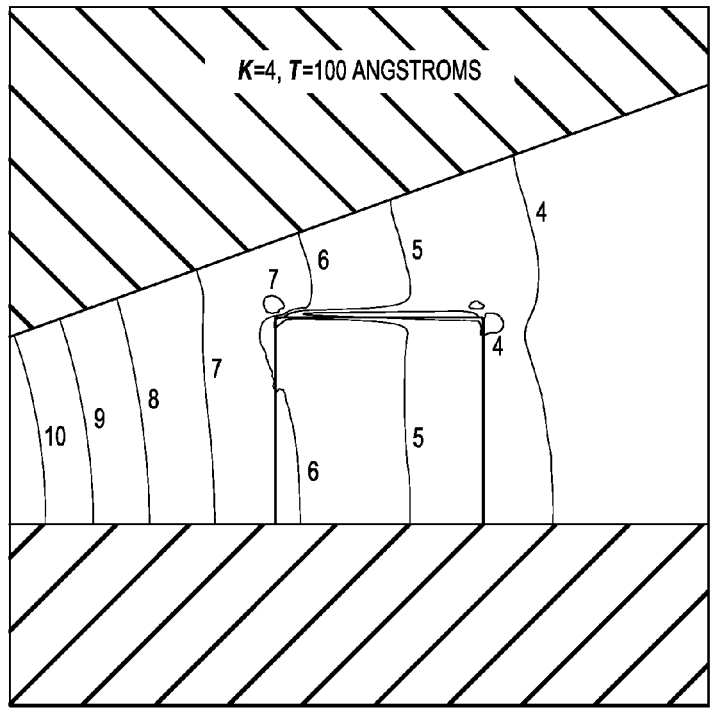
FIG. 2j shows electric field contours in the region, wherein the dielectric microstructure has a dielectric constant of 4; and the walls of the dielectric microstructure has a thickness of 100 angstroms.
Figure 2K:
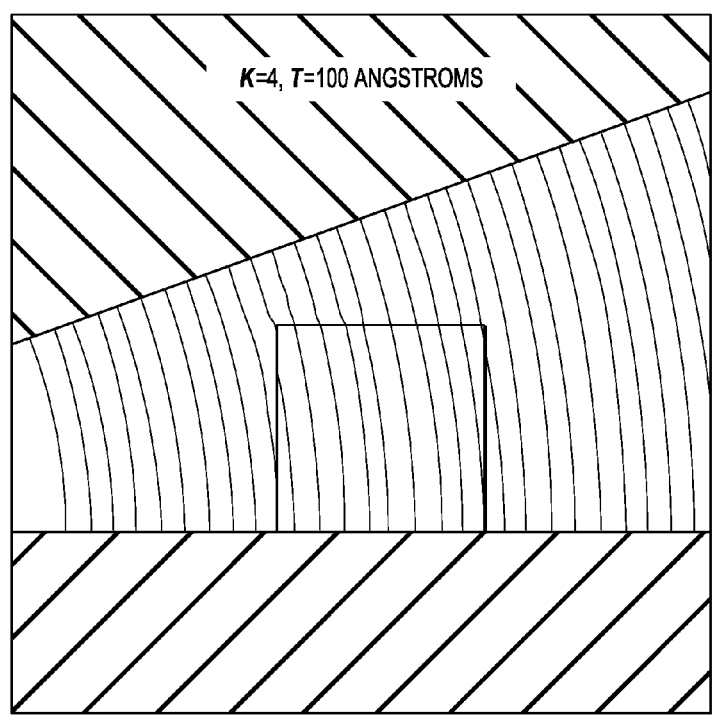
FIG. 2k is a diagram showing electric field lines in the region, wherein the dielectric microstructure has a unit dielectric constant; and the walls of the dielectric microstructure has a thickness of 100 angstroms.

FIG. 2j and FIG. 2k respectively show electric field contours and field lines in the vicinity of a dielectric microstructure whose sidewalls having a reduced thickness of 100 angstroms and dielectric constant K=4. Electric contours 3 and 10 respectively represent electric fields 0.80 V/um and 1.85 V/um. The electric field Ec at the contact point is 1.40 V/um. FIG. 2j also provides a blowup of the field contours in the vicinity of the contact point. The dashed line in the blowup represents the volumetric region about the contact point having a high electric field gradient.

It is noted that the electric field contours deviate from those in air dielectric microstructure shown in FIG. 2b, while the deviation is less than those in solid dielectric microstructure shown in FIG. 2d; and even less than those in dielectric microstructures shown in FIG. 2f and FIG. 2h. The electric field lines deviate from those in air dielectric microstructure shown in FIG. 2c, while the deviation is less than those in solid dielectric microstructure shown in FIG. 2e and is even less than those in dielectric microstructures shown in FIG. 2g and FIG. 2i.

Figure 2L:
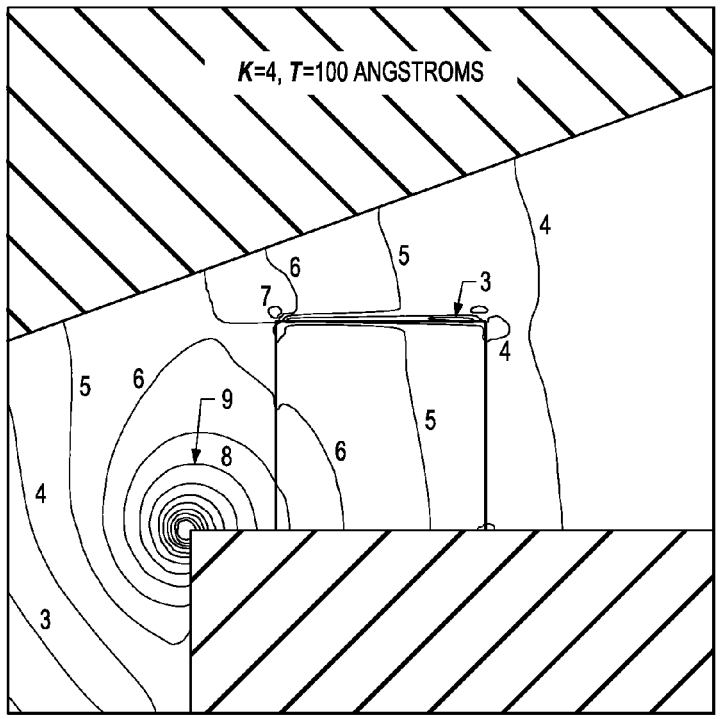
FIG. 2l shows electric field contours in the vicinity of the corner of the bottom electrode, wherein the dielectric microstructure has a dielectric constant of 4; and the walls of the dielectric microstructure each have a thickness of 100 angstroms.
Figure 2M:
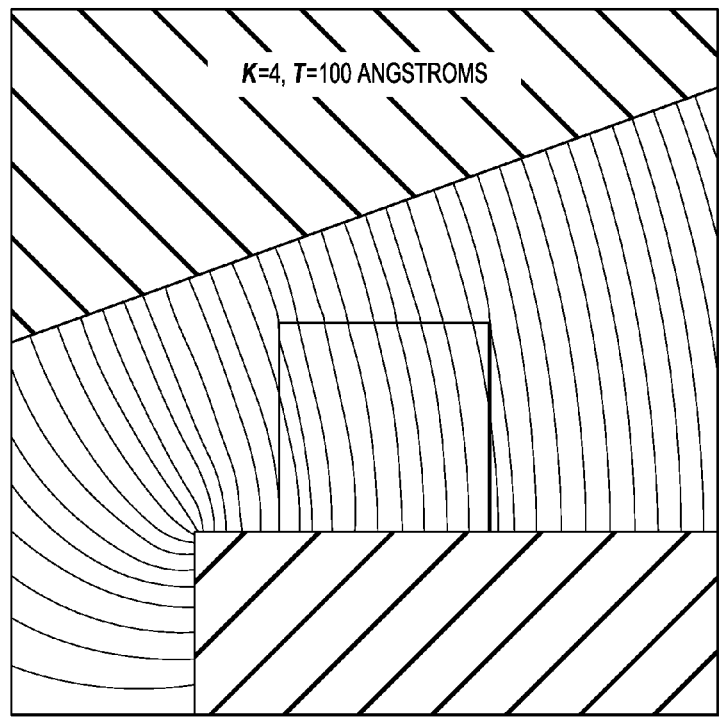
FIG. 2m shows electric field lines in the vicinity of the corner of the bottom electrode, wherein the dielectric microstructure has a dielectric constant of 4; and the walls of the dielectric microstructure each have a thickness of 100 angstroms.

FIG. 2l and FIG. 2m show the electronic field contours and electric field lines in the vicinity of the edge of the bottom electrode and the thickness of the dielectric microstructure sidewalls is 100 angstroms. Compared to that in FIG. 2a, the top and bottom electrodes are configured as a capacitor with finite length, as an edge of the bottom electrode appears in the middle of the top electrode. It can be seen that the electric field contours and electric field lines are similar to those shown in FIG. 2j except that electric field gradient is established around the edge of the bottom electrode.

Figure 2N:
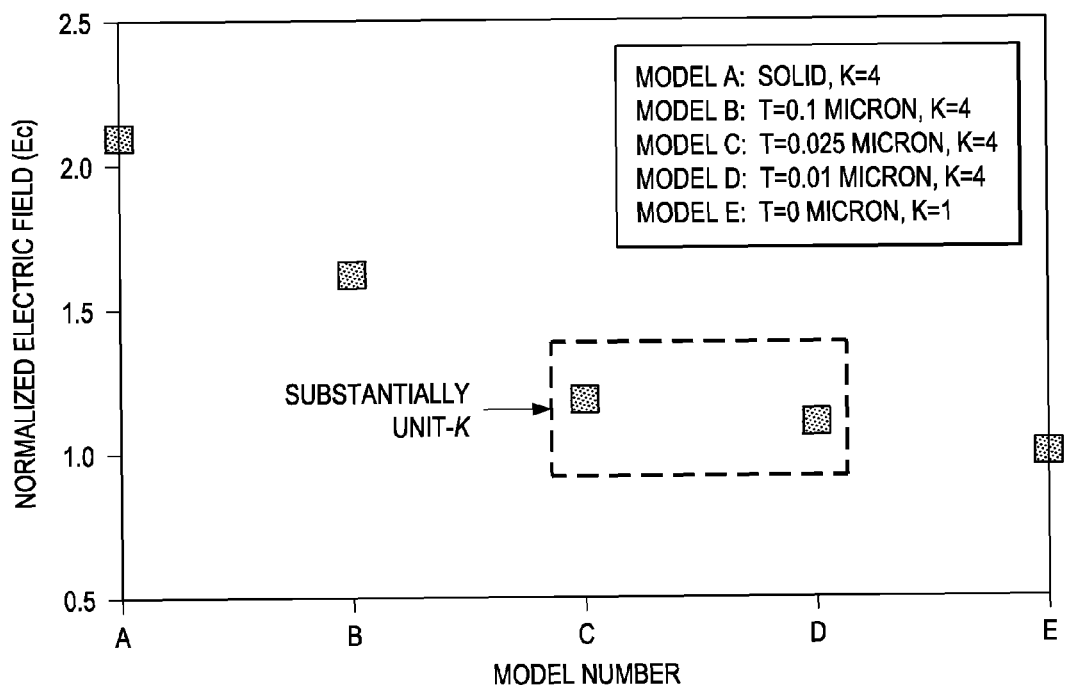

The effect of the sidewall thickness on the electric fields is partially summarized in FIG. 2n. Referring to FIG. 2n, the vertical axis plots the normalized electric field at the contact point, and the horizontal axis plots the model number. Specifically, model A represents the setup in FIG. 2a with the dielectric microstructure having a solid body and a dielectric constant 4. Model B represents the setup in FIG. 2a with the dielectric microstructure having a thickness of 0.1 micron and a dielectric constant 4. Model C represents the setup in FIG. 2a with the dielectric microstructure having a thickness of 0.025 micron and a dielectric constant 4. Model D represents the setup in FIG. 2a with the dielectric microstructure having a thickness of 0.01 micron and a dielectric constant 4. Model E represents the setup in FIG. 2a with the dielectric microstructure having a thickness of 0 (a virtual dielectric microstructure) and a dielectric constant 1 (a virtual air dielectric microstructure).

It can be seen in FIG. 2n that the electric field Ec at the contact point decreases as the thickness of the sidewall of the dielectric microstructure decreases. As discussed above with reference to FIG. 2a through FIG. 2m, the electric field contours and electric field lines in the vicinity and inside the body of dielectric microstructure are more close to those in virtual air dielectric microstructure (unit K and zero thickness as shown in FIG. 2b and FIG. 2c).

Figure 2O:
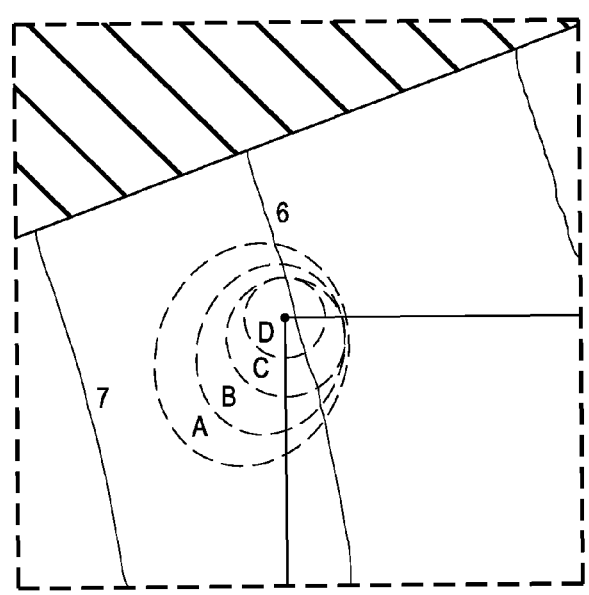
FIG. 2o shows the volumetric region in the vicinity of the contact point of the dielectric microstructure having a high electric field gradient vs. the thickness of the sidewalls of the dielectric microstructure.

The volumetric region in the vicinity of the contact point (e.g. contact point C as shown in FIG. 2a) having a high electric field gradient vs. the thickness of the sidewalls of the dielectric microstructure is diagrammatically illustrated in FIG. 2o. Dashed contours A, B, C, and D represent the volumetric regions having a high electric field gradient for models A, B, C, and D as described in FIG. 2n. Specifically, Model A represents the setup in FIG. 2a with the dielectric microstructure having a solid body and a dielectric constant 4. Model B represents the setup in FIG. 2a with the dielectric microstructure having a thickness of 0.1 micron and a dielectric constant 4. Model C represents the setup in FIG. 2a with the dielectric microstructure having a thickness of 0.025 micron and a dielectric constant 4. Model D represents the setup in FIG. 2a with the dielectric microstructure having a thickness of 0.01 micron and a dielectric constant 4. As can be seen in FIG. 2o, the region of high field gradient diminishes as the dielectric constant approaches substantially unity-K.

Deviation of electric field contours and electric field lines from those in dielectric microstructure having unity-K cause establishment of electric fields and electric field gradients at the interfaces/surfaces intercepting the electric field, as shown in FIG. 2d through FIG. 2m. These established electric fields and electric field gradients in turn cause electric field emission, free-electron initiated reactions, dielectric charging, dielectrophoresis, and/or other effects to the dielectric microstructure and/or other functional components of a device having the dielectric microstructure. As the thickness of the sidewall of the dielectric microstructure reduces, the electric fields and electric field gradients are reduced; and the dielectric microstructure behaves more and more as the air dielectric microstructure with unity-K in electric fields. In contrast to those having sidewalls with larger thicknesses, dielectric microstructures having sidewalls of less thicknesses behave more and more transparent to electric fields applied thereto. Effects caused by deviated electric field contours and lines, such as electric field emission, free-electron initiated reactions, dielectric charging, dielectrophoresis, and/or other effects are reduced with the reduction of the thickness of sidewalls of the dielectric microstructure.

Reduction of effects caused by deviated electric field contours and lines, such as electric field emission, free-electron initiated reactions, dielectric charging, dielectrophoresis, and/or other effects, can be of great importance in some applications, such as micromirror devices and other types of microstructure devices. Examples of microstructures using dielectric microstructure having substantially unity-K will be discussed afterwards with reference to FIG. 22 through FIG. 24.

In general, the dielectric microstructure may have any desired geometric configuration, such as characteristic dimensions and shapes. When used in microstructures, the dielectric microstructure has a characteristic dimension in the order of microns. In the example as shown in FIG. 1, the dielectric microstructure comprises three major side walls; and the dielectric microstructure can be formed on a substrate such that the side walls and the top surface of the substrate form a substantially enclosed air space (104) in the cross-sectional view. Each one of the major sidewalls of the shell (102) preferably has a thickness T of 100 microns or less, such as 50 microns or less, 1 micron or less, 500 nanometers or less, 200 nanometers or less, 100 nanometers or less, 50 nanometers or less, 30 nanometers or less. In examples wherein application of the dielectric microstructure (100) expects the dielectric microstructure to have certain mechanical property, it is preferred that the thickness of the sidewall(s) has a thickness of 50 angstroms or higher, such as 100 angstroms or higher, 1 nanometers or higher or 3 nanometers or higher depending upon the specific application of the dielectric microstructure. For example in micromirror devices, which will be detailed afterwards with reference to FIG. 23a and FIG. 23b, the sidewall(s) of the dielectric microstructure has a thickness from 1 nanometer to 50 nanometers, and more preferably from 3 nanometers to 10 nanometers. Of course, the sidewall(s) of the dielectric microstructure may have other desired or suitable thicknesses. It is noted that the sidewalls of the dielectric microstructure (100) may have different thicknesses. In some examples, one or more sidewalls of the dielectric microstructure may not be intercepting electric field lines during application, or the effect caused by the deviation of electric field contours and lines, such as electric field emission, free-electron initiated reactions, dielectric charging, dielectrophoresis, and/or other effects do not affect the performance of the device.

Depending upon the specific application, the dielectric microstructure (100) may have any suitable dimensions, such as characteristic dimension D. In one example, especially in micromirror, the dielectric microstructure may have a characteristic dimension D of 2000 microns or less, 1000 microns or less, 500 microns or less, 200 microns or less, 100 microns or less, 50 microns or less, 10 microns or less, 5 microns or less, and 1 microns or less, but preferably (not required) larger than 500 angstroms.

The dielectric microstructure may have any desired geometric shapes, such as cubical, spherical, or other types of polyhedrons with or without fine structures, such as concaves and/or convexes. In one example, the dielectric microstructure as discussed above with reference to FIG. 1 can be implemented as a polyhedron, such as a cylinder (e.g. a cubic cylinder) that is diagrammatically illustrated in FIG. 3.

Figure 3:
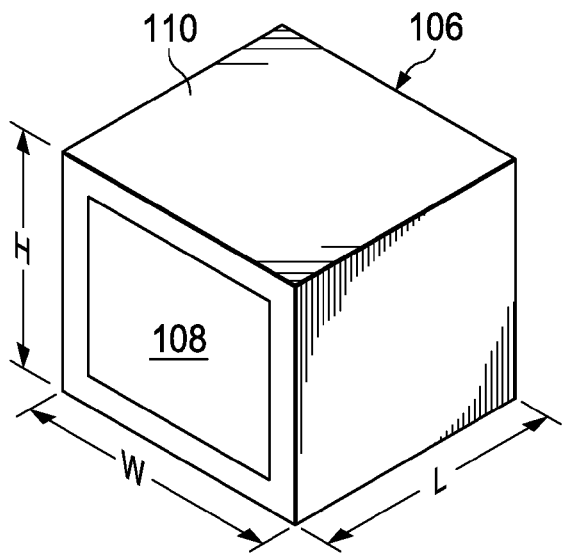
FIG. 3 schematically illustrates a perspective view of an exemplary dielectric microstructure having a substantially unit-dielectric constant.

Referring to FIG. 3, dielectric microstructure 106 is a cubic structure. The cubic dielectric microstructure (106) may have 4, 5 or 6 or other desired numbers of major sidewalls or facets. Specifically, the cubic dielectric microstructure (106) may have 4 major sidewalls, such as e.g. two pairs of parallel sidewalls or two pairs of tapered sidewalls with two opposite opening ends. The sidewalls of the cubic dielectric microstructure (106) form an air space 108 that can be the same as the air space 104 in FIG. 1. In other examples, the sidewalls of the dielectric microstructure (106) can form a void, a recessed or a hollow fine structure.

The cubic dielectric microstructure (106) has a width W, a length L, and a height H. Even though values of width W, length L, and height H may depend upon specific applications, the width W, length L, and the height H are preferably in the order of microns, such as 50 microns or less, 10 microns or less, 5 microns or less, and 1 microns or less. As discussed above with reference to FIG. 1, the sidewalls of the cubic dielectric microstructure may or may not have identical thickness or material. However, it is preferred that the sidewalls intercepting electric fields during application have a thickness such that these sidewalls are substantially "transparent" to the electric fields intercepting these sidewalls as the sidewalls discussed above with reference to FIG. 1.

Figure 4:
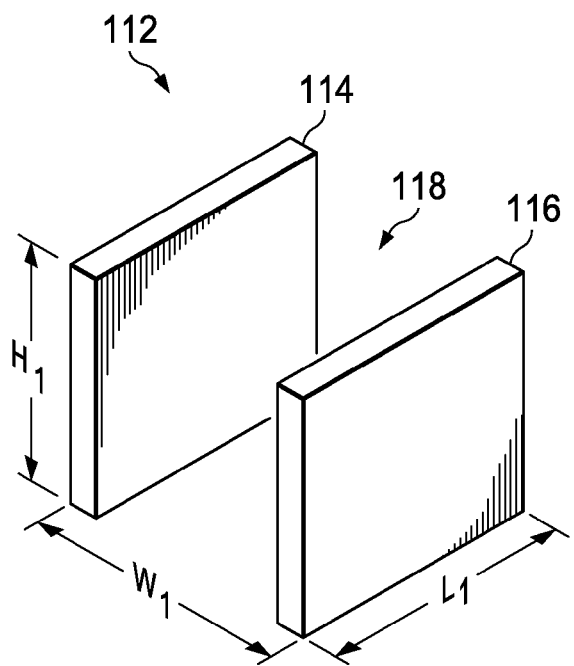
FIG. 4 schematically illustrates a perspective view of another exemplary dielectric microstructure having a substantially unit-dielectric constant.

Depending upon specific applications, the dielectric microstructure may have other different configurations, one of which is schematically illustrated in FIG. 4. Referring to FIG. 4, the dielectric microstructure (112) in this example comprises side walls 114 and 116 that are formed on a substrate (which is not shown in the figure). Side walls 114 and 116 can be parallel with a distance (width $W_1$). The sidewalls (114 and 116) form an air space (118) therebetween. The air space (118) may comprise the same material as air space 104 in FIG. 1, which will not be repeated herein.

The length of each side wall has a length $L_1$, and height $H_1$. Depending upon the specific application; the length $L_1$ and height $H_1$ each may have a dimension of 1000 microns or less, such as 500 microns or less, 50 microns or less, 10 microns or less, 5 microns or less, and 1 microns or less.

The dielectric microstructure as discussed above, as well as many other variations can be fabricated in a wide range of different ways. As one example, an exemplary method of making a dielectric microstructure is schematically illustrated in cross-sectional views in FIG. 5 through FIG. 10.

Figure 5:
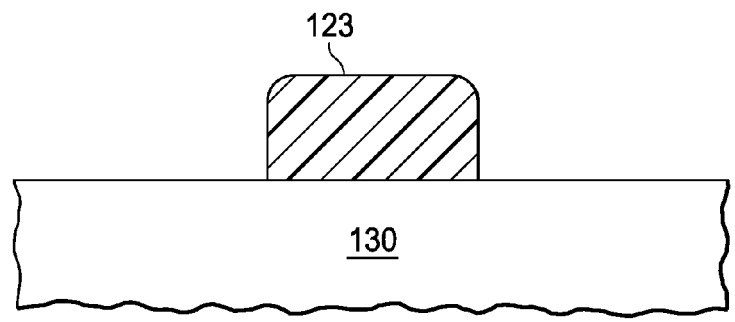
FIG. 5 through FIG. 10 schematically illustrate an exemplary method of making a dielectric microstructure.

Referring to FIG. 5, substrate 130 is provided. The substrate can comprise any suitable materials, and more preferably comprise a material that is chemically inert to the surface reactive agent used during the following processes. Mold 123 in the shape of the desired dielectric microstructure is formed on substrate 130. The mold (123) may have any suitable materials, and more preferably an organic material, such as photoimaginable organic materials. A reactant is diffused to the mold (123) so as to form the desired material and structure (e.g. the shell and/or the side walls) of the dielectric microstructure, as schematically illustrated in FIG. 6.

Figure 6:
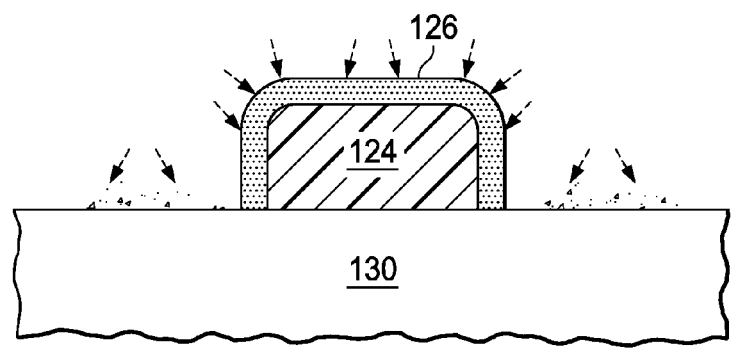
Figure 11:
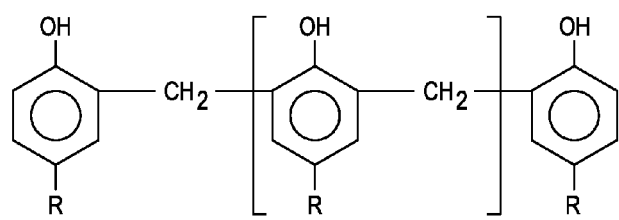
FIG. 11 shows an exemplary mold material for use in making a dielectric microstructure of $Al_2O_3$ with substantially unity-K.

Referring to FIG. 6, a gas or vapor-phase reactant (reactive agent) can be thermally diffused into a thin outer layer (126) of the mold (123). The reactant can be selected according to what dielectric material is desired for the completed dielectric microstructure (e.g. $Al_2O_3$, $SiO_2$), and according to its ability to chemically react with the mold material (e.g. an organic mold material). For example, to fabricate a dielectric microstructure with $Al_2O_3$ side walls, $AlCl_3$ (Lewis acid) can be selected as the reactant, in combination with a novolac-based, positive photoresist as the mold material. Other suitable Lewis acids can be $AlBr_3$, $BCl_3$, $BF_3$, $FeBr_3$, $FeCl_3$, $SnCl_4$, and $TiCl_4$. An exemplary novolac resin, which is a polymeric phenol groups that contain oxygen, is shown in FIG. 11. The reaction of $AlCl_3$ with a phenol group is illustrated in FIG. 12.

Figure 12:
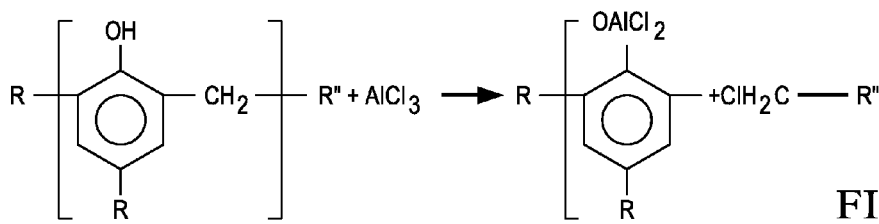
FIG. 12 shows the chemical reaction of $AlCl_3$ with a phenol group with the chemical reaction being used in making a dielectric microstructure having substantially unity-K.

Referring to FIG. 12, because $AlCl_3$ is a strong Lewis acid (or electron-pair acceptor) it attacks the oxygen site of the phenol group and forms —$OAlCl_2$. This reaction weakens the C—C bond between the benzene and alkyl (—$CH_2$—R") group and causes scission of the polymer chain. The chain breakup is followed by reaction of a hydrogen and a chlorine atom with the polymer fragments. The net result can be chain scission and insertion of a covalently bonded aluminum atom. Diffusion of $AlCl_3$ from the surface into the bulk of the novolac resin is aided by the chain scission process.

Referring again to FIG. 6, the porosity and thickness of the diffused layer (126) can be controlled by the reactant partial pressure, diffusion time, and diffusion temperature of the diffusion process. After the diffusion, a diffused layer (126) is formed at the outer layer (126) of mold 123, and the non-diffused portion (124) of the mold (123) is inside the diffused outer layer (126).

Figure 7:
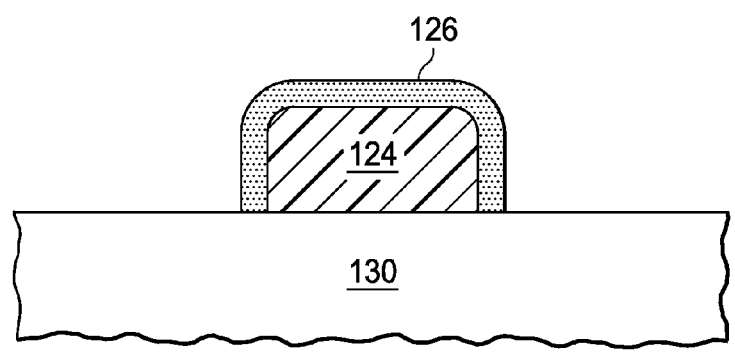

During the diffusion, excess reactant may exist, and can be removed, as schematically illustrated in FIG. 7. The excess reactant can be removed by many ways, such as thermal evaporation under vacuum.

Figure 8:
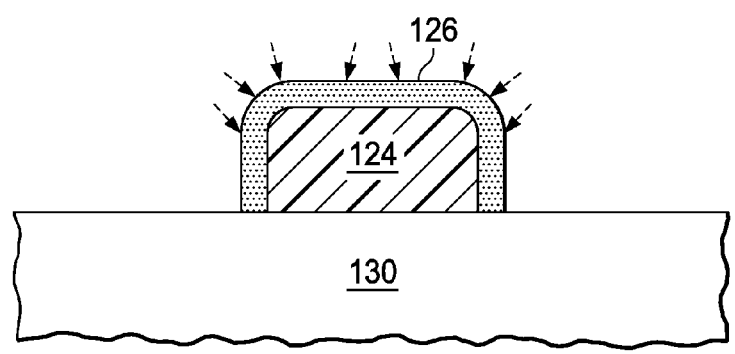

In addition to excess reactant, unreacted absorbate may exist in the mold. If the unreacted absorbate in the mold will be a liability later in the manufacturing process, it can be converted to a benign form by a plasma or thermal reaction with a passivating gas or vapor, as schematically illustrated in FIG. 8.

Figure 9:
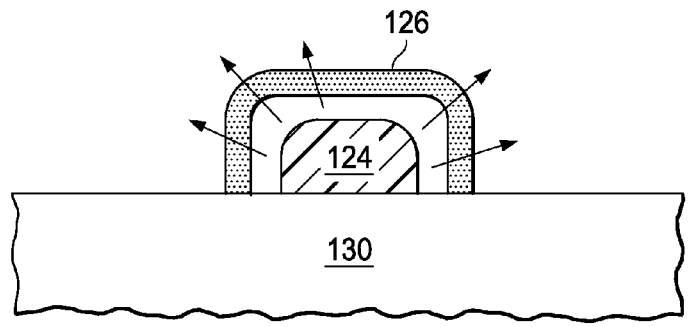

After removal of excess reactant or after conversion of unreacted absorbate (if performed), the interior mold material can be removed and the reacted outer layer converted into desired materials, as schematically illustrated in FIG. 9. Referring to FIG. 9, the interior mold portion (124) can be removed by many suitable methods, such as plasma ashing; and the reacted outer layer (126) near the surface can be converted into desired materials, such as a porous dielectric layer that comprises a mixture of metal oxide and organometallic compounds. As the plasma ashing process moves to the interior of the outer layer, the porous outer layer (126) left behind enables the free exchange of ashing (e.g. O* and F*) and product gases (e.g. $H_2O$ and $CO_2$).

In some examples such as a method for making a micromirror device having a dielectric microstructure, the ashing step can be performed during many possible stages of the entire fabrication process. For example, the ashing process can be performed later in the entire fabrication process, at the same time the sacrificial layers for the MEMS structure are ashed. If the mold is ashed before deposition of a sacrificial layer, condensable vapors may be trapped in the formed outer layer (e.g. formed outer layer 126), which may degrade the MEMS device quality; or even cause device failure.

Figure 10:
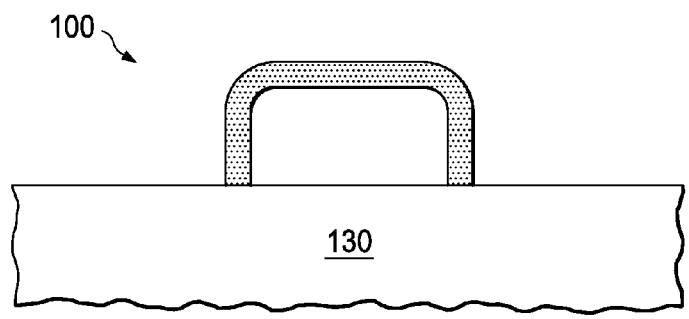

Because of the nature of the thermal diffusion process, the density of the converted material (e.g. the metal oxide) can be highest at the surface of the mold and decreases with increasing depth. At some point the density of the converted material is insufficient to maintain a cohesive mechanical structure, resulting in dielectric "dust" that is trapped in the interior of the formed outer layer (126), where it is rendered harmless. After removing the interior unreacted mold material, the desired dielectric microstructure (100) with outer layer (side walls) is formed on substrate 130, as schematically illustrated in FIG. 10.

For demonstration purpose, a specific process for creating a dielectric microstructure with a porous outer layer (side walls) using an organic sacrificial mold is schematically illustrated in FIG. 13 through FIG. 17. The fabrication method is based upon the reaction of $AlCl_3$ with novolac-based positive photoresist.

Figure 13:
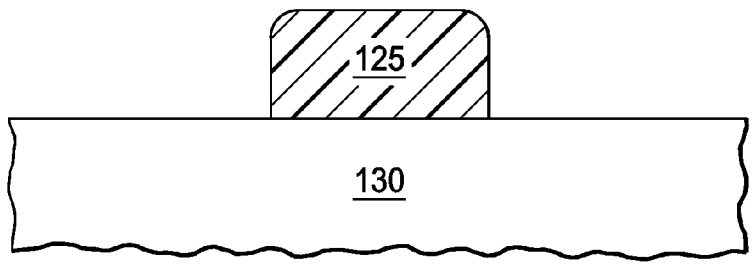
FIG. 13 through FIG. 17 schematically illustrate an exemplary method of making a dielectric microstructure of $Al_2O_3$ with substantially unity-K.

Referring to FIG. 13, substrate 130 is provided. The substrate may be an aluminum alloy. Aluminum is inert to $AlCl_3$. However, adventious water in the presence of $AlCl_3$ may create HCl, and the HCl may attack an unpassivated aluminum surface. Therefore, it is preferred to perform the following diffusion (FIG. 14), excess reactant removal (FIG. 15a), and unreacted absorbate conversion (FIG. 15b) processes without breaking vacuum.

Organic mold 125 is formed on substrate 130. Conventional novolac-based positive photoresist (novolac resin and diazonapthoquinone photoactive compound, PAC) is exposed and developed in the desired outer layer (side walls) shape. This step can be followed by a hardbake to drive off solvent and promote some degrees of cross-linking for improved thermal stability during the subsequent diffusion process.

Figure 14:
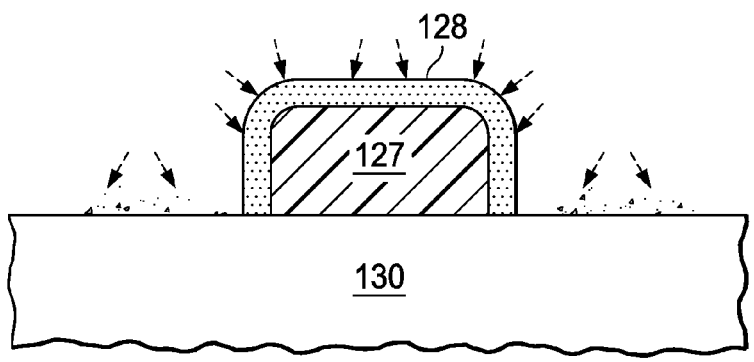

A diffusion step can be performed as illustrated in FIG. 14. Referring to FIG. 14, $AlCl_3$ is thermally diffused into a thin outer layer (128) of the novolac resin mold (125). The depth profile of reactant and product densities is determined by the $AlCl_3$ partial pressure, temperature, and diffusion time. The above parameters are selected to render the desired porosity and thickness (e.g. 3-10 nm) of the final outer layer (128).

Figure 15A:
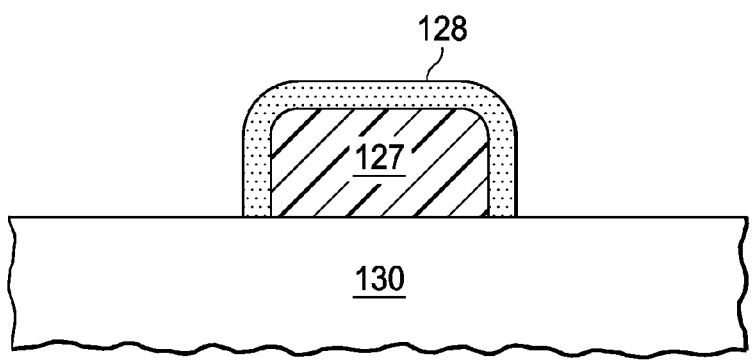

The excess reactant can be removed as illustrated in FIG. 15a. It is preferred that excess $AlCl_3$ be completely removed from the substrate surface to prevent particulate generation and corrosion later in the fabrication process.

Figure 15B:
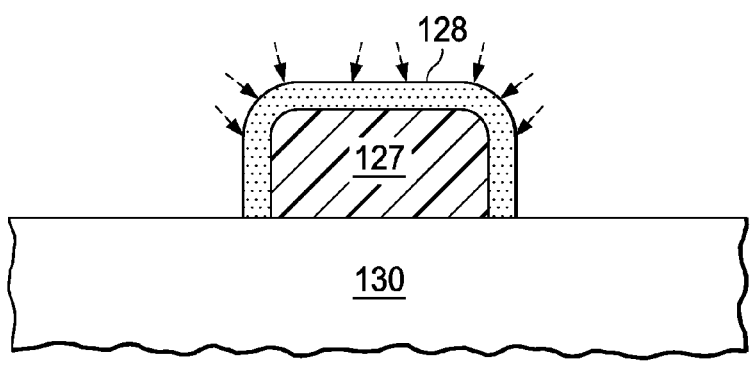

As an alternative step, unreacted $AlCl_3$ that is absorbed in the mold material can be converted to an inert form so that it will not generate corrosion when exposed to moisture later in the fabrication process as illustrated in FIG. 15b. One way to do this is by exposing the surface to fluorine plasma, converting the $AlCl_3$ to a more inert form $AlF_3$, to be converted during the final plasma ashing process to a mixture of $Al_2O_3$ and its organometallic compounds, such as a porous dielectric layer that comprises a mixture of metal oxide and organometallic compounds. As the plasma ashing process moves to the interior of the outer layer, the porous outer layer (128) left behind enables the free exchange of ashing or reactant gases (e.g. O* and F*) and product gases (e.g. $H_2O$ and $CO_2$).

Figure 16:
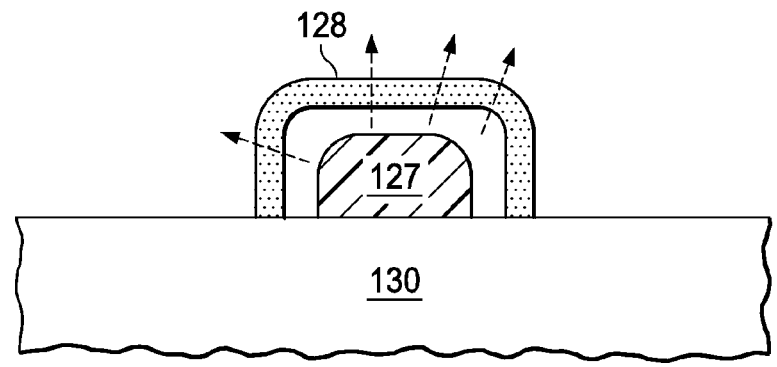
Figure 17:
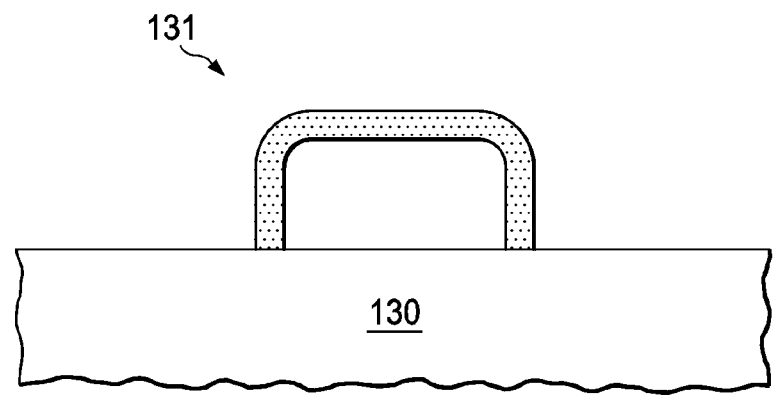

Referring to FIG. 16, the non-diffused portion (127) of the sacrificial mold material inside the formed outer layer can be removed. Assuming that the sacrificial layers in the MEMS device are also organic-based materials, the organic mold of the formed outer layer (128) can be removed by plasma ashing at the same time that the sacrificial layers are removed. This may be accomplished using a remote plasma source of reactive O and F free radicals. After removing the sacrificial mold material inside outer layer 128, the desired dielectric microstructure (131) is completed as schematically illustrated in FIG. 17.

Another exemplary method of making a dielectric microstructure is schematically illustrated in cross-sectional views in FIG. 26a through FIG. 26e, wherein the dielectric microstructure is formed through a negative mold process.

Figure 26A:
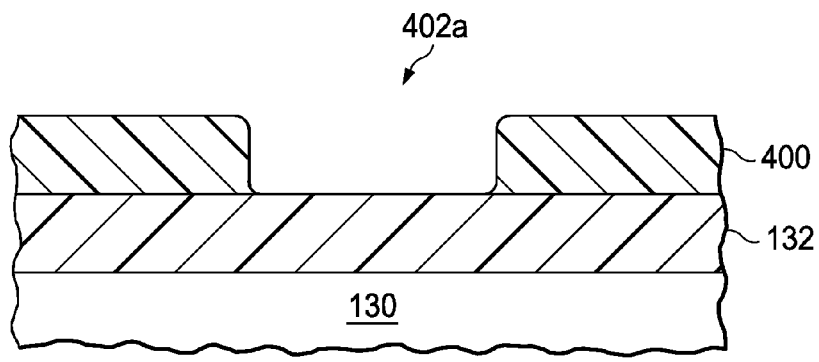
FIG. 26a through FIG. 26e schematically illustrate another exemplary method of making a dielectric microstructure.

Referring to FIG. 26a, substrate 130 is provided followed by depositing first mold layer 132 on substrate 130. The substrate (130) can be the same substrate as discussed above with reference to FIG. 13 through FIG. 17, or can be other suitable substrates. The mold layer comprises a material that can be the same as the material for the mold (125) as discussed above with reference to FIG. 13 through FIG. 17, or can be other suitable materials, such as other organic mold materials. Another mold material is deposited on mold layer 132 so as to form second mold layer 400. The mold material for second mold layer 400 may or may not be the same as the mold material for first mold layer 132. The second mold layer 400 can be patterned so as to form mold region 402a.

Figure 26B:
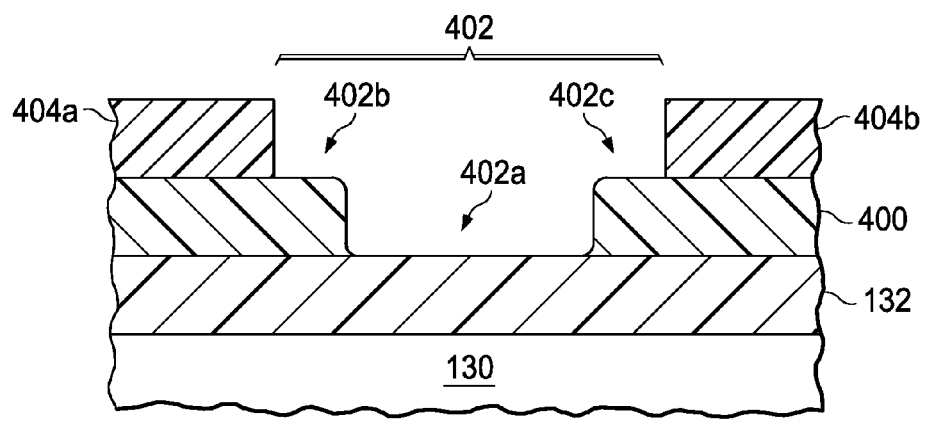
Figure 26C:
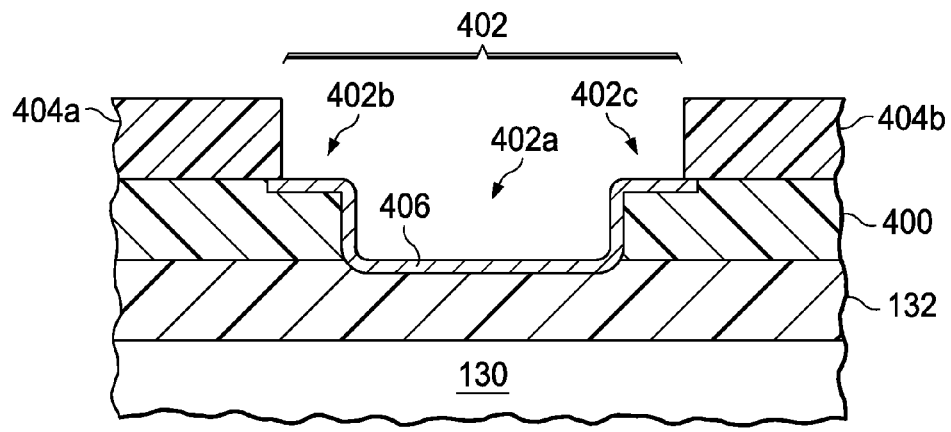

A metallic beam is formed on the top surface of the second mold layer 400. The metallic beam can be formed by depositing a beam layer comprising a selected material followed by patterning the deposited beam layer. As schematically illustrated in FIG. 26b, the patterned beam layer comprises an opening formed by portions 404a and 404b with the opening being aligned to mold region 402a and extending beyond mold region 402a to form additional mold regions 402b and 402c. The metallic beam has the benefit of not being etched because most ashing chemistries have high-selectivity relative to metallic layers.

The mold region (402) comprised of mold regions 402a, 402b and 402c has a shape that is substantially the same as the geometric profile of the desired dielectric microstructure. Accordingly, the second mold layer 400 preferably has a thickness that is substantially greater than the height of the desired dielectric microstructure. The patterned mold region (402a) together with the opening formed by metallic beam portions 404a and 404b that define mold regions 402b and 402c has a dimension (e.g. the width) that is equal to or larger than the width or length of the desired dielectric microstructure.

A thermal diffusion process, as well as an alternative step of removing excess reactant can be performed so as to convert the outer layer/surface of the mold region (402). The metallic beam portions 404a and 404b act to block the diffusion process outside the mold region 402. The diffusion and/or the removal of excess reactant process can be the same as those discussed above with reference to FIG. 6 and FIG. 7, which will not be repeated herein. The converted outer layer of mold region 402 is illustrated as element 406 in FIG. 26c.

Figure 26D:
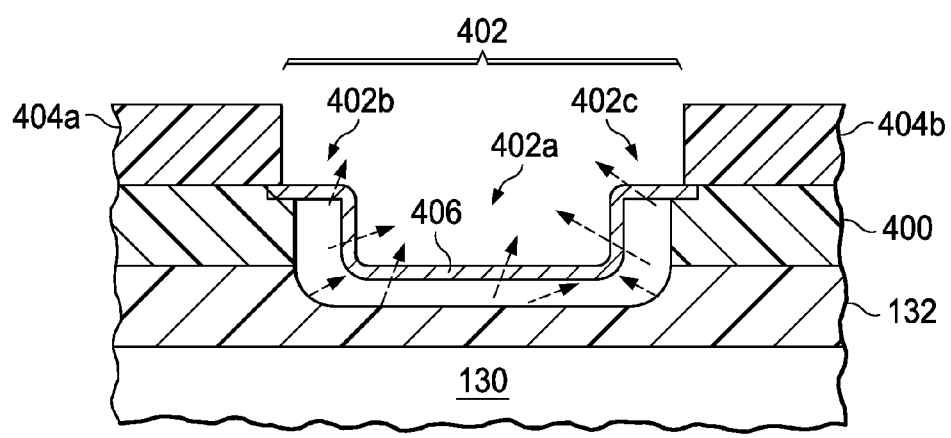
Figure 26E:
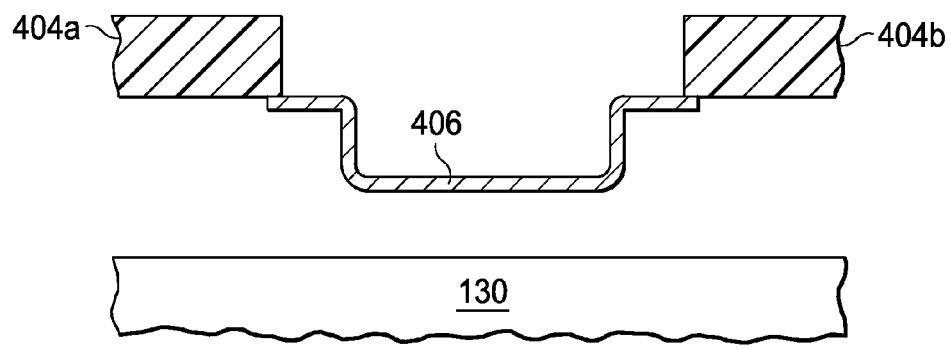

A plasma ashing process can be performed so as to remove the sacrificial mold materials in layers 132 and 400, as schematically illustrated in FIG. 26d. After removal of substantially all sacrificial mold materials, the desired dielectric microstructure is completed, which is schematically illustrated in FIG. 26e.

As discussed above with reference to FIG. 5 through FIG. 10, a dielectric microstructure can be formed by using a sacrificial mold having a reactive mold material. Alternatively, a dielectric microstructure can be formed by using a sacrificial mold having a non-reactive sacrificial mold material, an example of which is schematically illustrated in FIG. 27a through FIG. 27d.

Figure 27A:
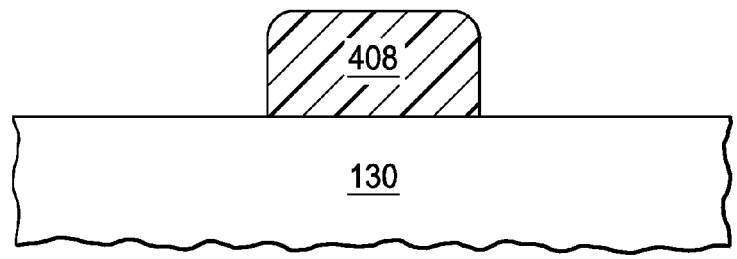
FIG. 27a through FIG. 27d schematically illustrate yet another exemplary method of making a dielectric microstructure.
Figure 27B:
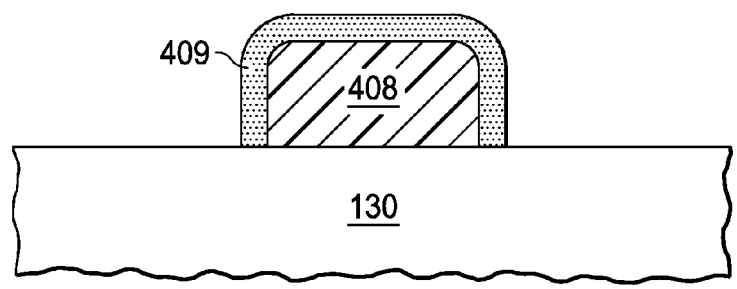

Referring to FIG. 27a, a sacrificial mold (408) having a non-reactive mold material is formed on substrate 130. A layer (409) comprising a material of the outer shell of the desired dielectric microstructure can be formed on the sacrificial mold (408) using a suitable deposition process, as schematically illustrated in FIG. 29b. For example, an atomic layer deposition process can be performed for forming an aluminum oxide layer on the sacrificial mold (408). Alternatively, a sputtering deposition process can be performed for forming a $SiO_2$ layer on the sacrificial mold (408). In the following removal process for the sacrificial mold material, it is preferred that formed outer layer (409) is a porous layer such that free exchange of ashing and ashing products can be achieved. In examples when the formed outer layer is not a porous layer, an etching pore can be formed as will be discussed afterwards.

Figure 27C:
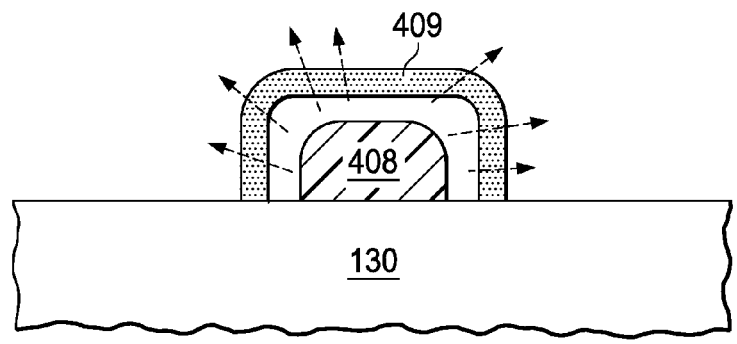
Figure 27D:
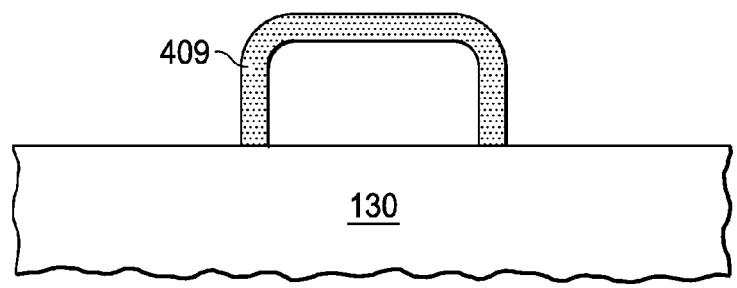

When the formed outer layer (409) is a porous layer, a plasma ashing process can be formed for removing the sacrificial mold material, as schematically illustrated in FIG. 27c. The plasma ashing process can be the same as that discussed above with reference to FIG. 9, which will not be repeated herein. After removing substantially all sacrificial mold material, the desired dielectric microstructure with unity-K can be formed, as schematically illustrated in FIG. 27d.

In some examples, the formed outer layer of the mold, which corresponds to the shell of the desired dielectric microstructure, may not be porous, rendering it almost impossible or inefficient to exchange plasma ashing and ashing products through the formed outer layer of the mold. This problem can be solved by forming a pore, an example of which is schematically illustrated in FIG. 28a through FIG. 28e. It is noted that the example illustrated in FIG. 28a through FIG. 28e can also be used for porous outer layers.

Figure 28A:
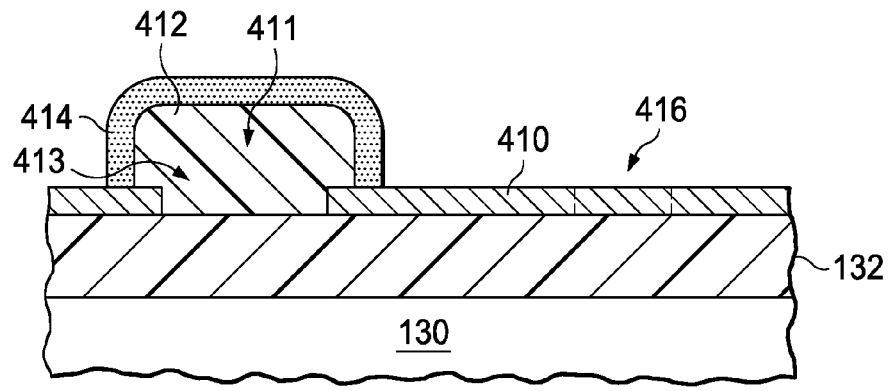
FIG. 28a through FIG. 28e schematically illustrate yet another exemplary method of making a dielectric microstructure.

Referring to FIG. 28a, substrate 130 is provided followed by depositing a sacrificial spacer layer (132) on the substrate. A beam layer 410 is deposited and patterned with an opening (413) so as to form a mold region (411), in which the desired dielectric microstructure can be formed. Specifically, sacrificial mold 412 can be formed in the mold region (411). The formed sacrificial mold can then be processed through a thermal diffusion process, as well as a process of removing excess reactant. The thermal diffusion process converts the exterior surface of the sacrificial mold (412) in to an outer layer (414) that comprises a desired material, which may or may not be porous.

Figure 28B:
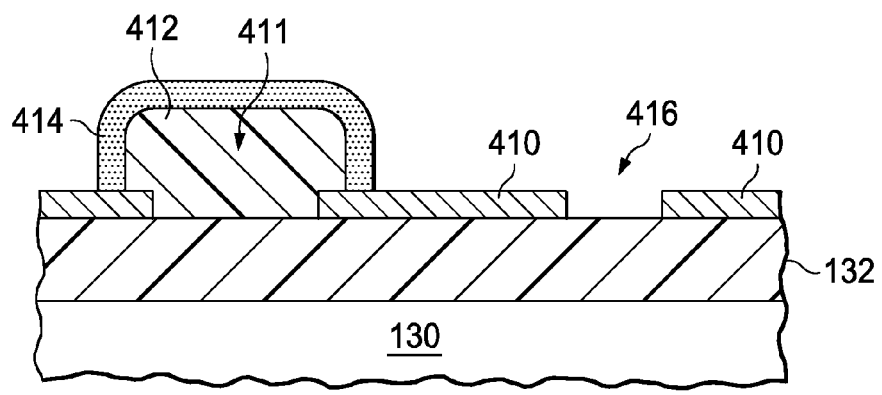
Figure 28C:
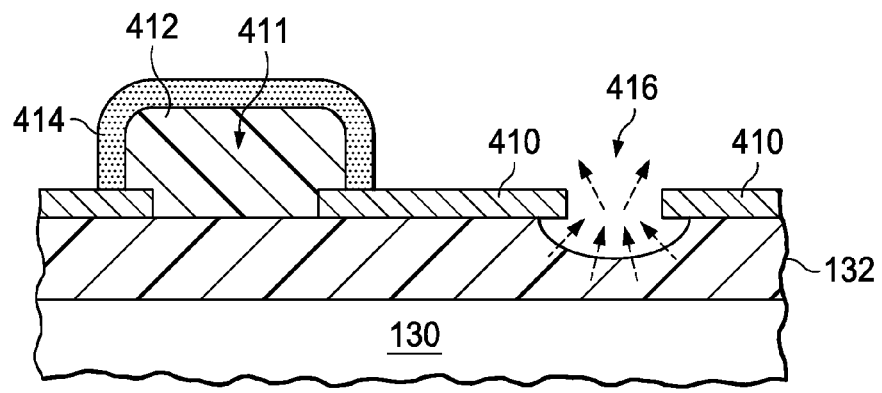
Figure 28D:
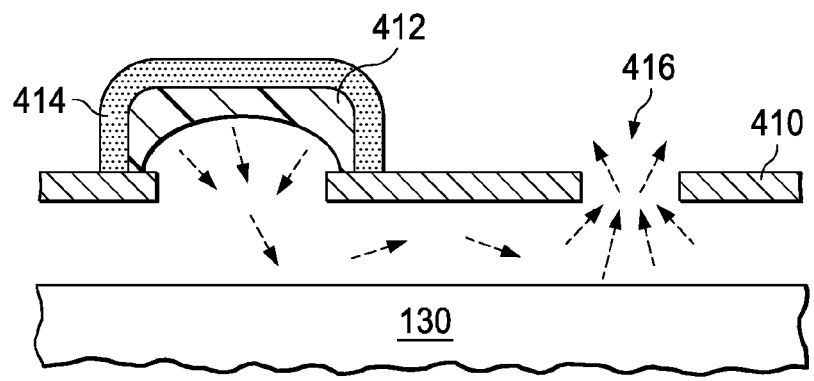
Figure 28E:
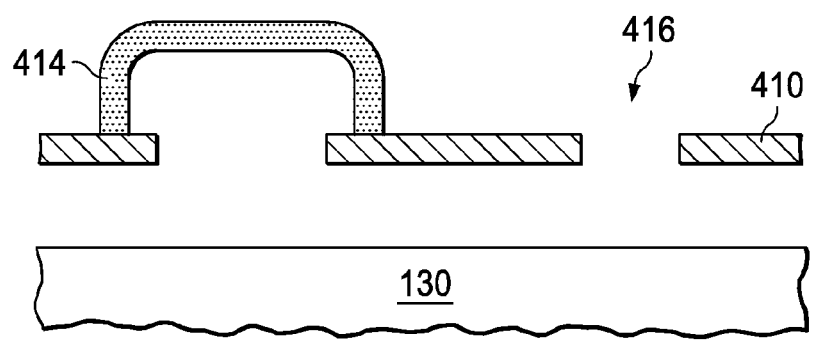

The beam layer (410) is also patterned so as to form pore 416 for the following plasma ashing process, as schematically illustrated in FIG. 28b. In this particular example, pore 416 is formed at a location that is distanced away from the mold region wherein sacrificial mold 412 is formed. Specifically, pore 416 is substantially not overlapped with the sacrificial mode 412. With the formed pore (416), a plasma ashing process can be performed to remove mold material 132, as schematically illustrated in FIG. 28c. The plasma ashing radicals and the ashing products can be exchanged through the formed pore (416). The sacrificial mold material (412) inside the formed outer layer (414) can also be removed through pore 416, as schematically illustrated in FIG. 28d. After removing substantially all sacrificial mold material, the desired dielectric microstructure can be formed as illustrated in FIG. 28e.

Variations of the process as discussed above with reference to FIG. 28a through FIG. 28e for forming a pore are possible. In one example wherein the material for the sacrificial spacer layer (132) is selected so that among its other properties it is non-reactive to the thermal diffusion process that converts the exterior surface of the sacrificial mold (412) into the desired material, the pore (416) can be formed substantially at the same time as the mold region (411). In this example as indicated in FIG. 28a, the opening (413) that forms mold region (411) and the pore (416) indicated by the dotted lines can be patterned together in beam layer (410), eliminating the process step shown in FIG. 28b where the pore (416) is patterned by itself.

Other than using a pore as discussed above with reference to FIG. 28a through FIG. 28e, a pore can be formed at the outer layer, an exemplary method of which is schematically illustrated in FIG. 29a through FIG. 29f.

Figure 29A:
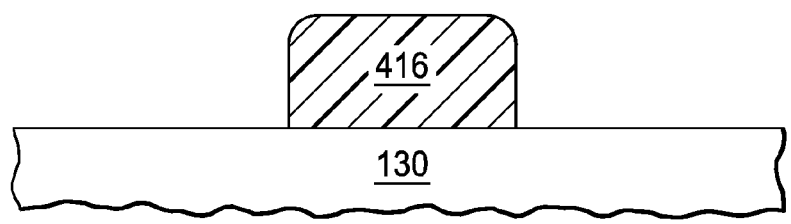
FIG. 29a through FIG. 29f schematically illustrate yet another exemplary method of making a dielectric microstructure.
Figure 29B:
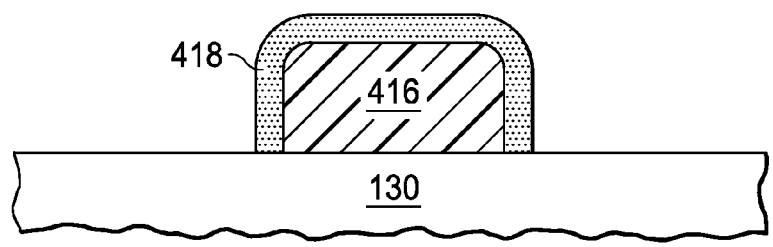

Referring to FIG. 29a, substrate 130 is provided followed by depositing a sacrificial mold layer (416) on the substrate. An outer layer (418) can be formed at the exterior surface of mold 416. The outer layer (418) can be formed by converting the surface of mold 416 through a thermal diffusion process as discussed above, or can alternatively by depositing the outer layer (418) on the surface of mold 416. The formed outer layer on the surface of mold 416 is schematically illustrated in FIG. 29b.

Figure 29C:
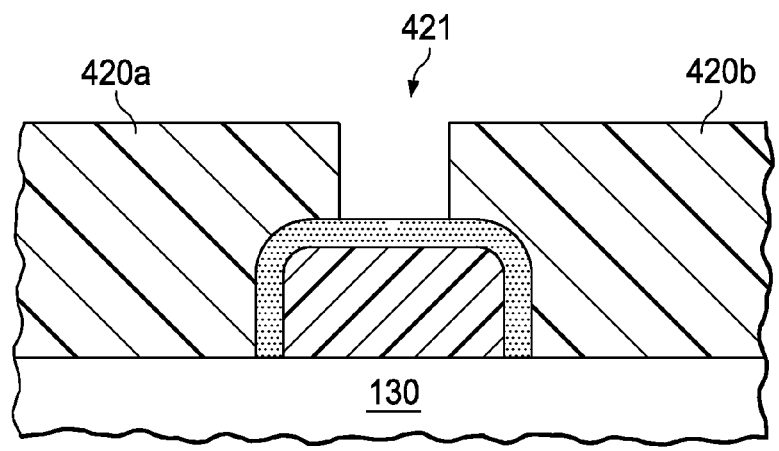

On the substrate (130) and the formed outer layer (418), a photoresist layer can be deposited and patterned so as to form pore 421 as schematically illustrated in FIG. 29c. The pore (421) is formed between photoresist portions 420a and 420b of the patterned photoresist layer.

Figure 29D:
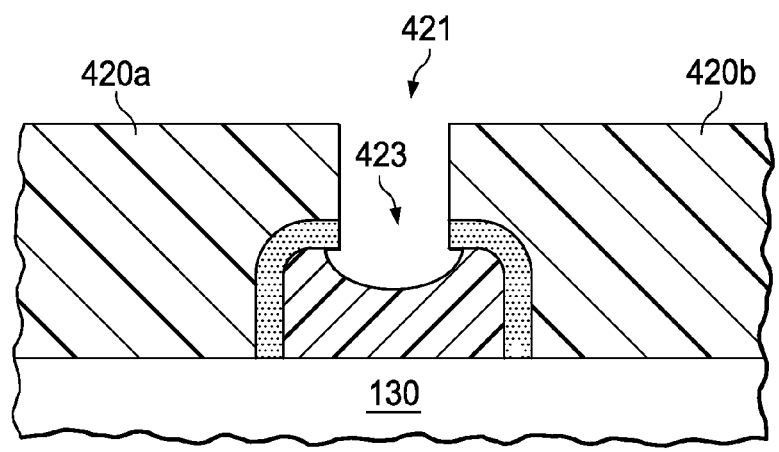
Figure 29E:
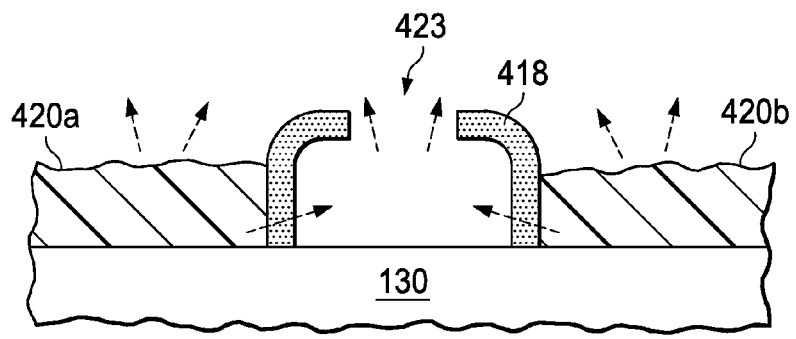
Figure 29F:
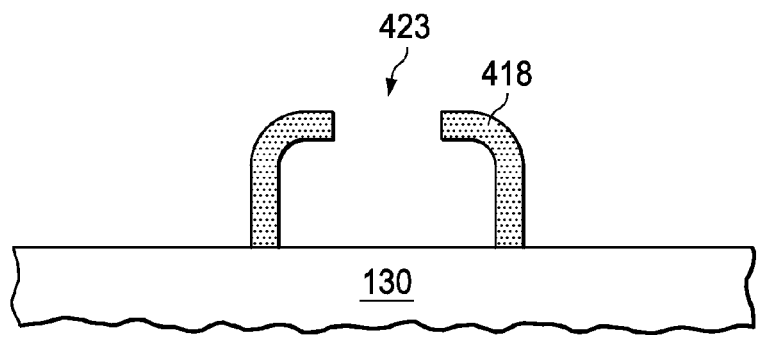

An anisotropic reactive ion etch can then be performed so as to open a hole (423) in the outer layer (418) through pore 421, as schematically illustrated in FIG. 29d. With the formed hole 423 in the outer layer (418) and pore 421 in the patterned photoresist layer, an exit channel can be obtained for removing the sacrificial material of the mold by plasma ashing or a gasifying process, as schematically illustrated in FIG. 29e. After removing substantially all sacrificial mold material, the desired dielectric microstructure can be obtained, as schematically illustrated in FIG. 29f.

Another exemplary method of forming a dielectric microstructure using a dedicated hole for removing the sacrificial mold material is schematically illustrated in FIG. 30a through FIG. 30e.

Figure 30A:
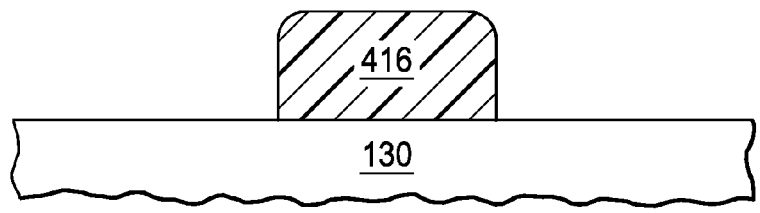
FIG. 30a through FIG. 30e schematically illustrate yet another exemplary method of making a dielectric microstructure.
Figure 30B:
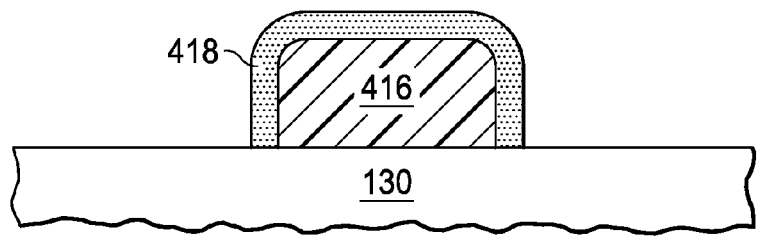
Figure 30C:
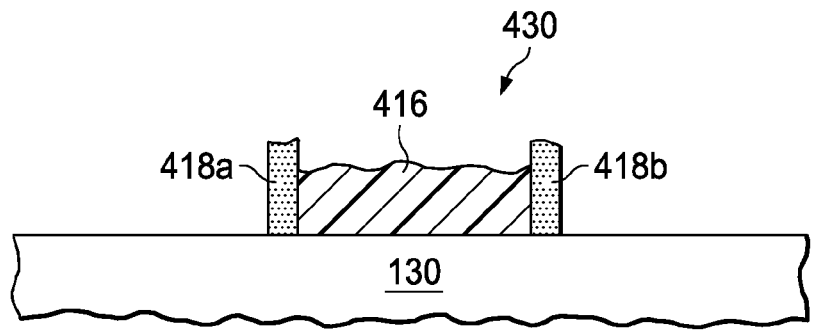

Referring to FIG. 30a, substrate 130 is provided followed by depositing a sacrificial mold layer (416) on the substrate. An outer layer (418) can be formed at the exterior surface of mold 416 as illustrated in FIG. 30b. The outer layer (418) can be formed by converting the surface of mold 416 through a thermal diffusion process as discussed above, or can alternatively by depositing the outer layer (418) on the surface of mold 416.

Figure 30D:
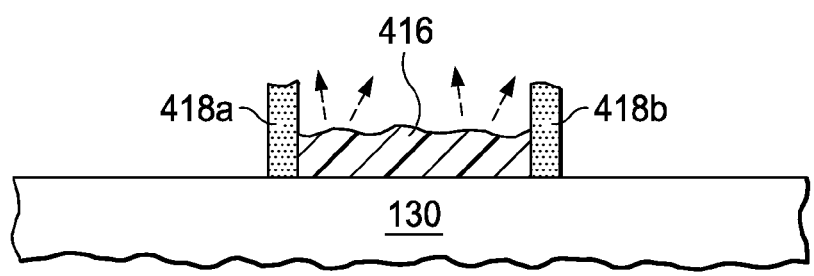
Figure 30E:
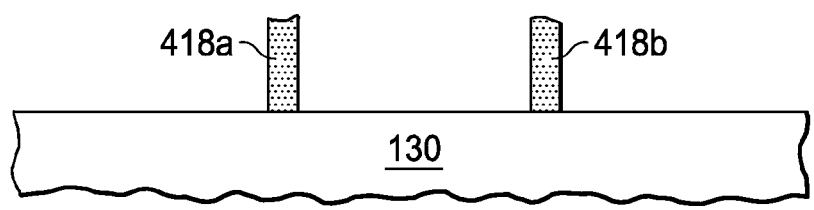

An anisotropic reactive ion etch can then be performed so as to open a hole (430) in the outer layer (418), as schematically illustrated in FIG. 29c. In one example, the formed hole 430 can be obtained by removing substantially the top portion of the formed outer layer (418), resulting in outer layer portions 418a and 418b. Alternatively, the formed hole 430 can be a hole at the top portion of the outer layer (418). With the formed hole 430 in the outer layer (418), the sacrificial material of the mold can be removed by a plasma ashing or a gasifying process, as schematically illustrated in FIG. 30d. After removing substantially all sacrificial mold material, the desired dielectric microstructure can be obtained, as schematically illustrated in FIG. 30e.

It is noted that the above fabrication methods are only selected examples. Other variations are also applicable. For example, other reactive agents (reactants) and organic materials are also applicable. One example is the silylation process used in top surface imaging (TSI), a technique developed for EUV lithography applications. Although there are a number of issues associated with the widespread use of TSI in lithography, the silylation chemistry developed for TSI can be directly applied to production of dielectric microstructures with minor modifications if needed.

In one TSI scheme, photoresist films (e.g. poly p-hydroxystyrene, PHOST) are exposed under conditions in which they are very strongly absorbing so that the exposure energy is deposited near the surface. The exposure causes a cross-linking reaction that modifies the permeability of the film near the surface.

The resist can then be exposed to a silylation agent, a reactive amino-silane vapor (e.g. dimethylsilyldimethylamine, DMSDMA) that diffuses into the resist and reacts with the oxygen sites on the phenol groups of the resist in much the same way as the previously described Lewis acid (e.g. $AlCl_3$) reacted with similar sites on phenol groups in a novolac resin. The silylating agent has a much lower diffusion rate into the exposed regions of the film. When the resist is dry developed with an oxygen plasma, the unexposed surface regions that received the maximum amount of silylation are oxidized to a glass and serve as a non-porous etch barrier to the underlying resist.

It can be seen that the silylation process can be adapted to the fabrication of porous, $SiO_2$ outer layer (side walls of the dielectric microstructure) by controlling the dosing of DMSDMA on unexposed molds made from PHOST resist. $AlCl_3$-novolac resin and DMSDMA-PHOST are but two examples of reactant and mold material combinations that can be adapted to the production of porous dielectric microstructures. Other combinations are also applicable.

As discussed above, a dielectric microstructure may have a wide range of different shapes. The shape can be controlled by controlling the shape of the mold. In one example as schematically illustrated in FIG. 18a, the shape of the mold can be controlled by using a soft mask during plasma ashing.

Figure 18A:
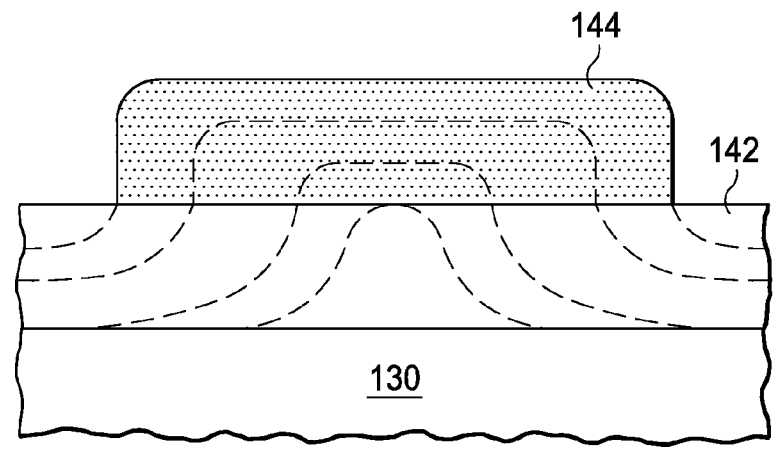
FIG. 18a and FIG. 18b schematically illustrate an exemplary method of controlling the shape of the a dielectric microstructure with substantially unity-K using soft masks.
Figure 18B:
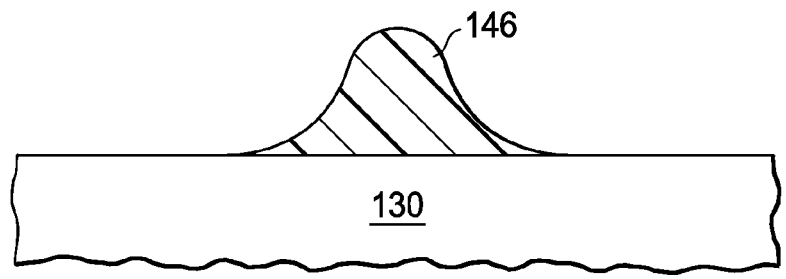

Referring to FIG. 18a, a selected mold material is deposited on substrate 130 to form a layer (142) with a thickness that is equal to or higher than the height of the desired mold. By using a soft mask, such as soft mask 144 during the plasma ashing with etching rate of 1:1, mold 146 with a smooth geometric profile can be formed on substrate 130 as schematically illustrated in FIG. 18b.

Figure 19A:
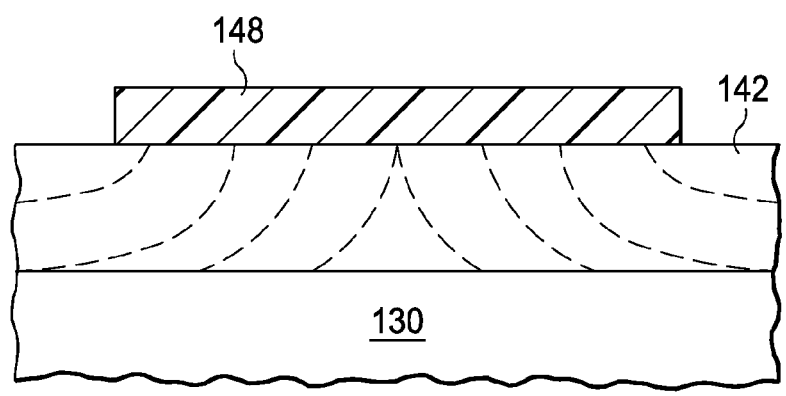
FIG. 19a and FIG. 19b schematically illustrate an exemplary method of controlling the shape of the a dielectric microstructure with substantially unity-K using hard masks.
Figure 19B:
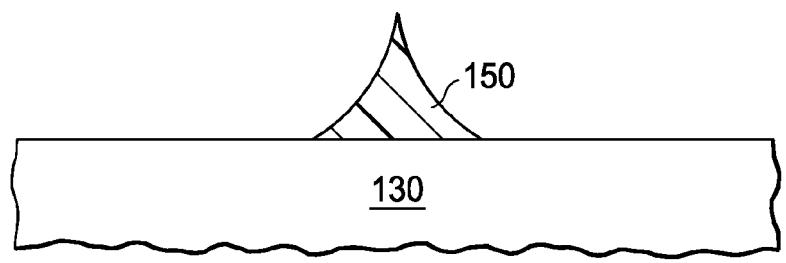

By using a hard mask, such as hard mask 148 for mold material layer 142 formed on substrate 130 as schematically illustrated in FIG. 19a, a mold 150 in the shape as schematically illustrated in FIG. 19b can be formed using a plasma ashing process in combination with mask stripping processes.

Figure 20A:
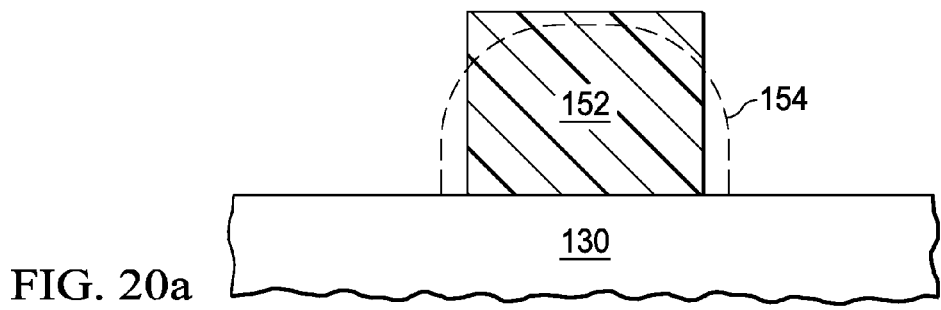
FIG. 20a and FIG. 20b schematically illustrate an exemplary method of controlling the shape of the a dielectric microstructure with substantially unity-K using a thermal reflow technique.
Figure 20B:
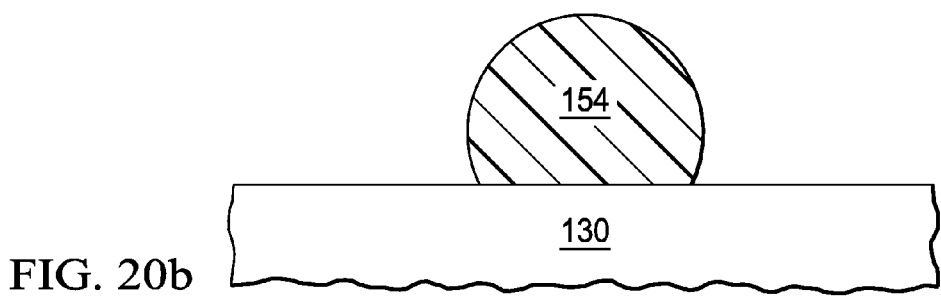

A hemispherical mold (154) as schematically illustrated in FIG. 20b can be formed using a thermal reflow process applied to a cubic-shaped resist mold (152) formed on substrate (130) as schematically illustrated in FIG. 20a.

Figure 21A:
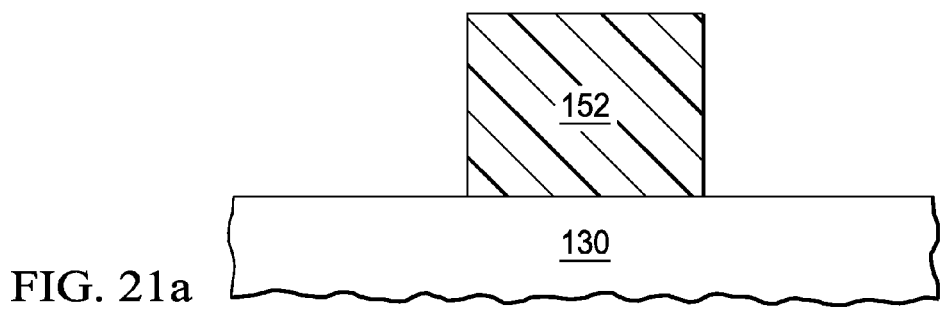
FIG. 21a and FIG. 21b schematically illustrate an exemplary method of controlling the shape of the a dielectric microstructure with substantially unity-K using a deep ultraviolet cure technique.
Figure 21B:
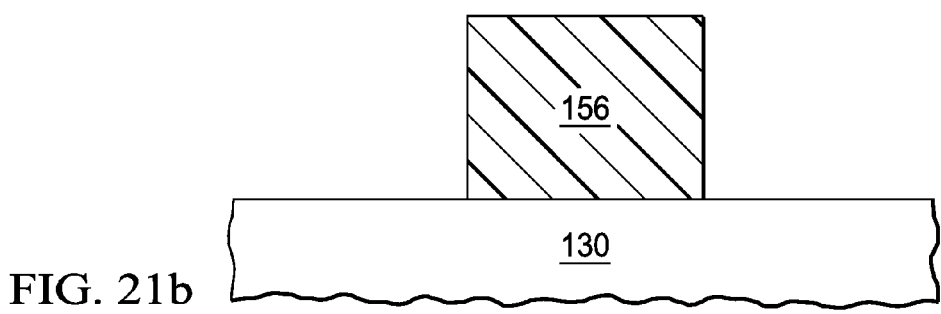

A mold (156) with a cubic shape as schematically illustrated in FIG. 21b can be formed by applying a deep ultraviolet cure process to a cubic-shaped resist mold (152) formed on a substrate (e.g. substrate 130) as schematically illustrated in FIG. 21a.

The dielectric microstructure as discussed above has many advantages. For example, a dielectric microstructure with porous outer layer (shell) can be created with conventional planar processing techniques using photoimaginable organic molds, and simple chemical vapor diffusion techniques. They can be ideal for unity-K motion stops for micromirror devices, which will be detailed afterwards, and other MEMS devices.

In other examples, the shell structures can be fashioned from a large variety of oxides by suitable choice of organic mold material and reactant, including but not limited to $Al_2O_3$ and $SiO_2$. A variety of shapes can be readily created by simple shape control techniques.

For MEMS devices that do not have unity-K dielectric materials or structures, but have high aspect ratio dielectric structures, examples of this disclosure can provide an alternative process that avoids the possible over etch and residue issues inherent in the conventional process of depositing and etching thick dielectric films or layers.

Figure 32:
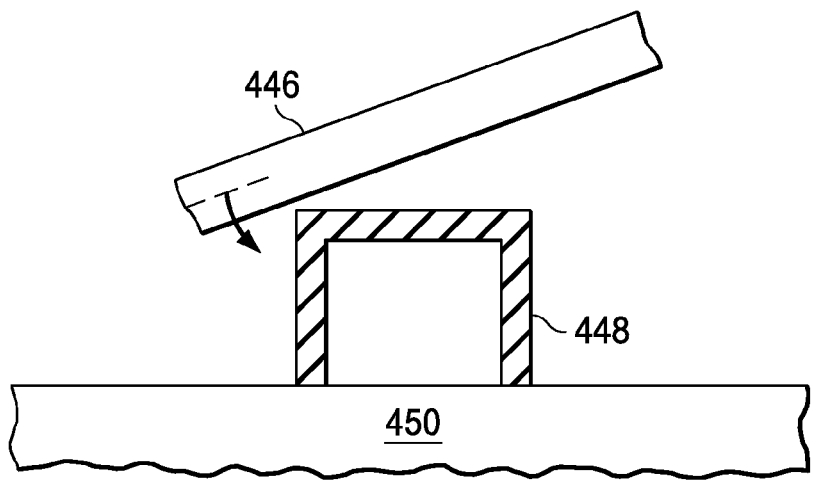
FIG. 32 schematically illustrates a cross-sectional view of another exemplary dielectric microstructure having a substantially unit-dielectric constant.
Figure 33:
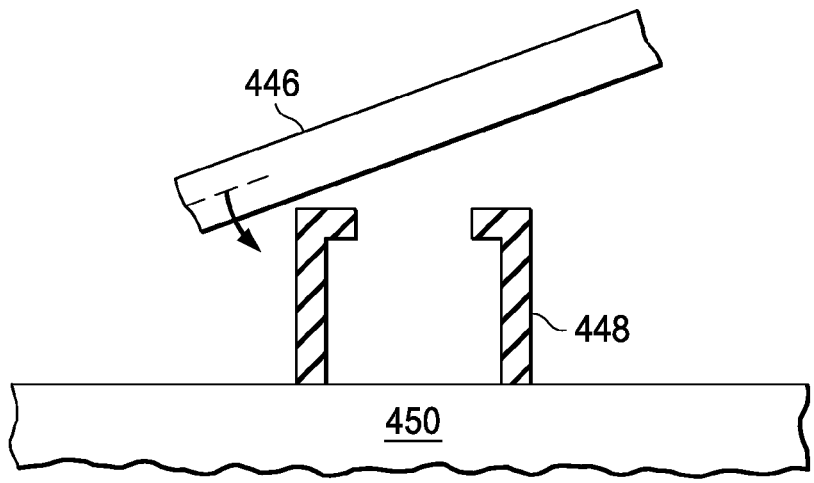
FIG. 33 schematically illustrates a cross-sectional view of another exemplary dielectric microstructure having a substantially unit-dielectric constant.

Depending upon the specific application, dielectric microstructures of the type discussed above may be used in a variety of architecturally distinct ways. For example, as diagrammatically illustrated in FIG. 32 and FIG. 33, movable top elements (446) are stopped by contact with dielectric microstructures (448) that are attached to the substrate (450). The dielectric microstructure (448) that is diagrammatically illustrated in FIG. 32 can be fabricated for example by the fabrication sequence shown in FIG. 13 to FIG. 17. The dielectric microstructure (448) that is diagrammatically illustrated in FIG. 33 can be fabricated for example by the fabrication sequence shown in FIG. 29a to FIG. 29f.

Figure 34:
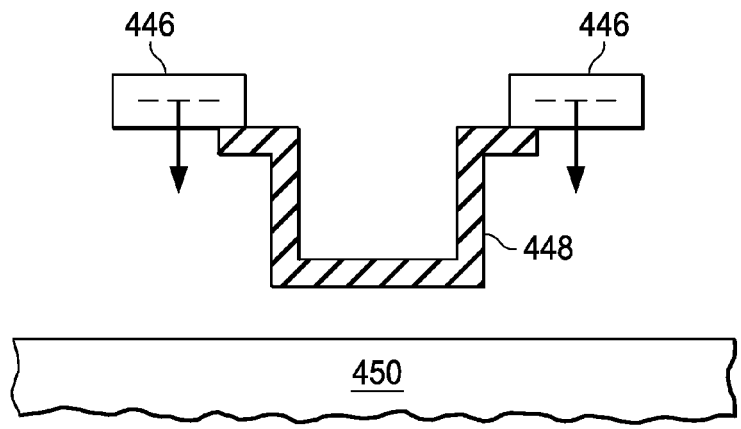
FIG. 34 schematically illustrates a cross-sectional view of another exemplary dielectric microstructure having a substantially unit-dielectric constant.

In another example as diagrammatically illustrated in FIG. 34, dielectric microstructure (448) that is attached to movable top element (446) acts to stop the motion of element (446) as the dielectric microstructures comes into contact with the substrate (450). The dielectric microstructure 448 can be fabricated by the fabrication sequence illustrated in FIG. 26a to FIG. 26e.

Figure 35:
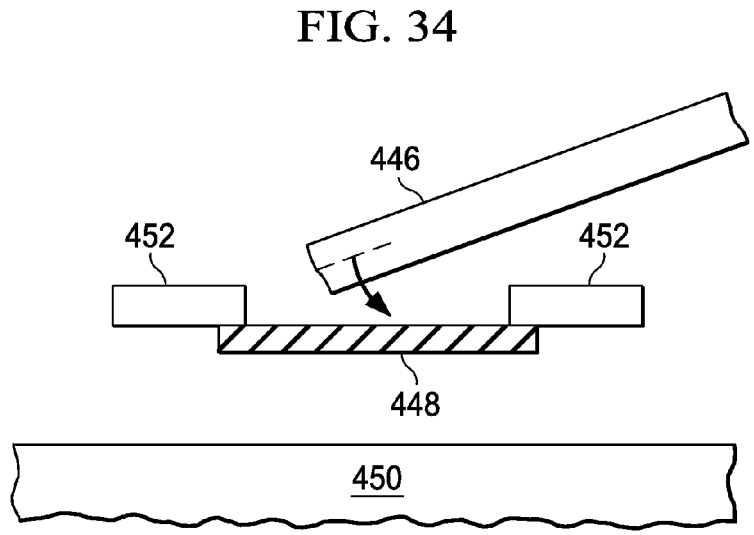
FIG. 35 schematically illustrates a cross-sectional view of another exemplary dielectric microstructure having a substantially unit-dielectric constant.
Figure 36:
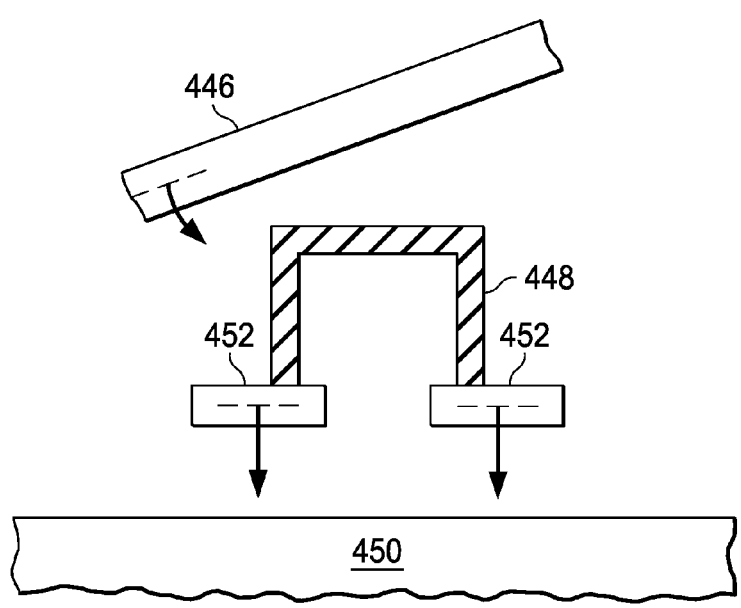
FIG. 36 schematically illustrates a cross-sectional view of another exemplary dielectric microstructure having a substantially unit-dielectric constant.

In more examples illustrated in FIG. 35 and FIG. 36, movable top elements (446) are stopped by contact with dielectric microstructures (448) that are attached to middle elements (446) that are suspended above substrate (450). In the case of FIG. 35, the movable top element (446) comes into contact with a dielectric microstructure (448) that is in the shape of a planar membrane attached to the middle element 446. The planar dielectric microstructure 448 is fabricated by a modification of the fabrication sequence illustrated in FIG. 26a to FIG. 26e.

Figure 37:
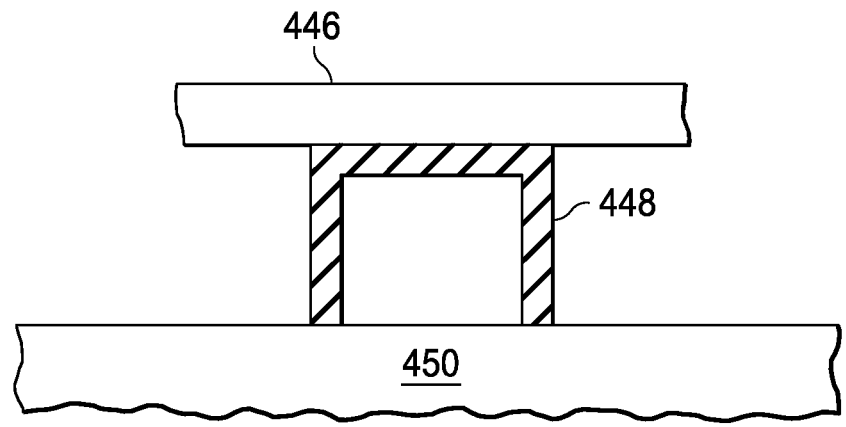
FIG. 37 schematically illustrates a cross-sectional view of another exemplary dielectric microstructure having a substantially unit-dielectric constant.
Figure 38:
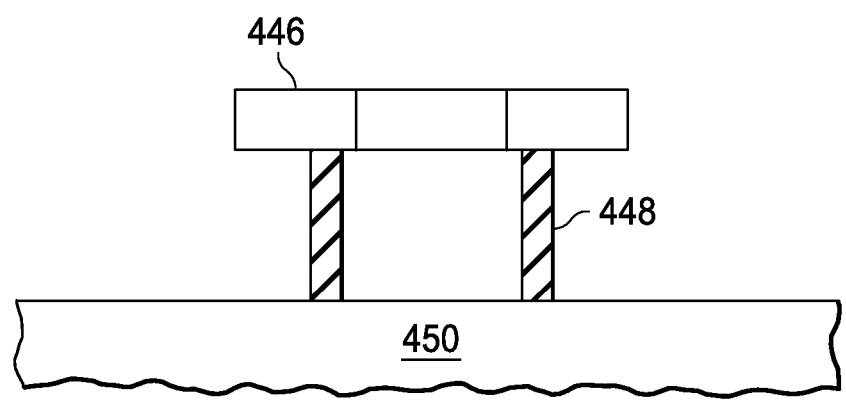
FIG. 38 schematically illustrates a cross-sectional view of another exemplary dielectric microstructure having a substantially unit-dielectric constant.

In a final pair of examples illustrated in FIG. 37 and FIG. 38, dielectric microstructures (448) act to support top elements (446) above the substrate (450).

Figure 40A:
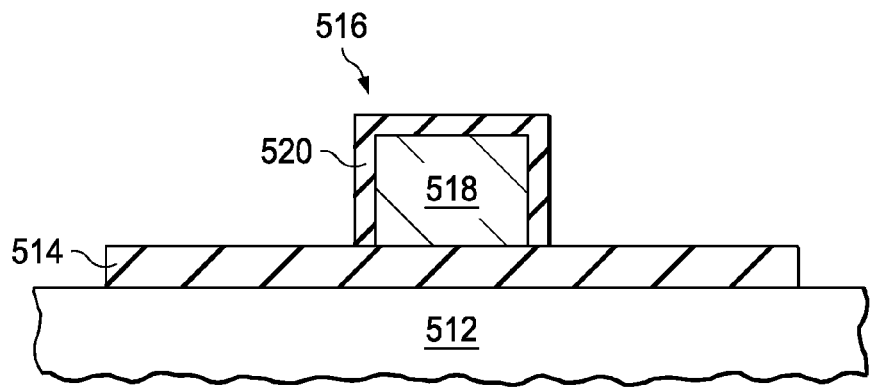
FIG. 40a through FIG. 40f schematically illustrates yet another exemplary method of making a dielectric microstructure.
Figure 40B:
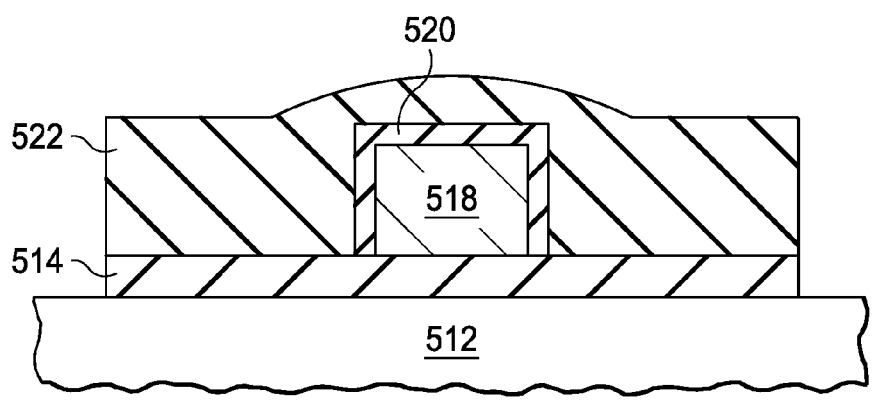
Figure 40C:
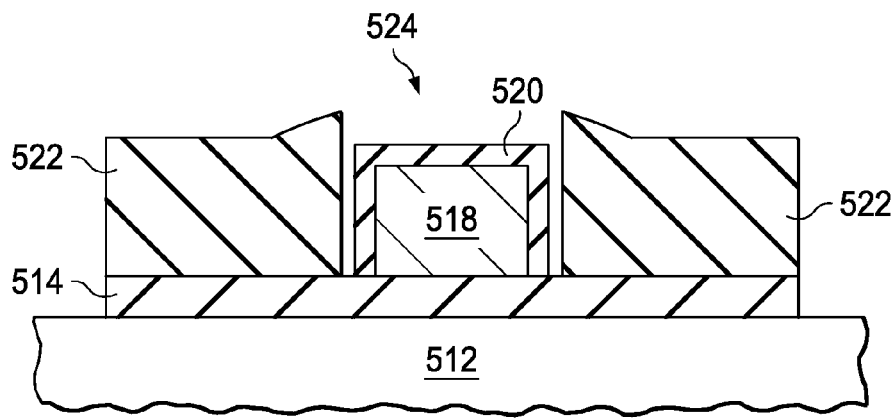
Figure 40D:
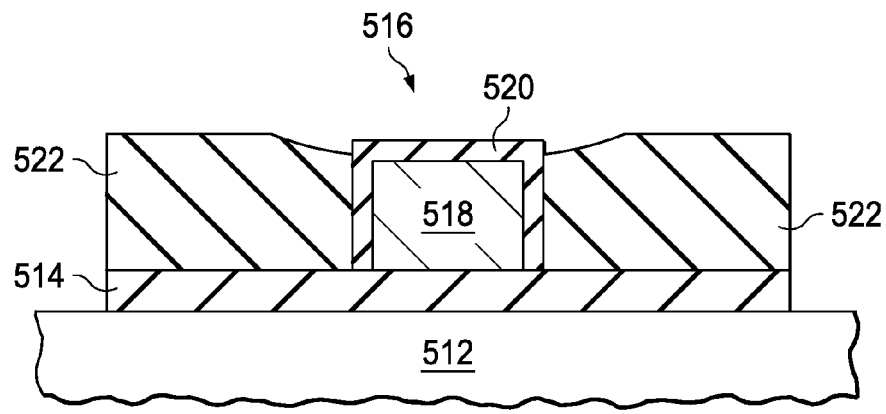
Figure 40E:
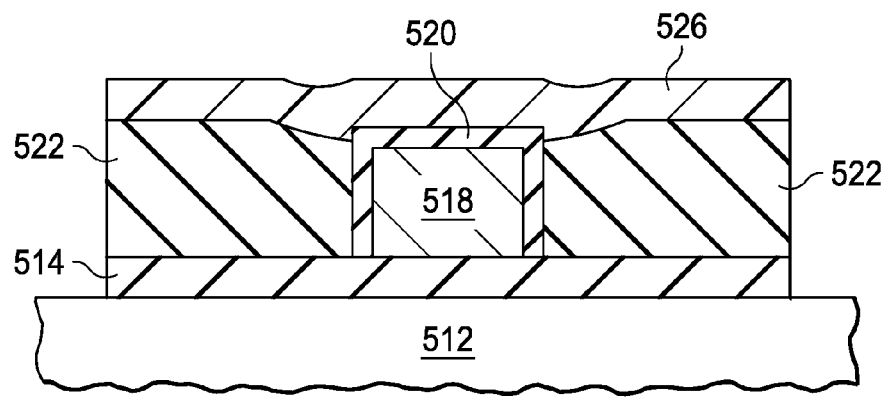
Figure 40F:
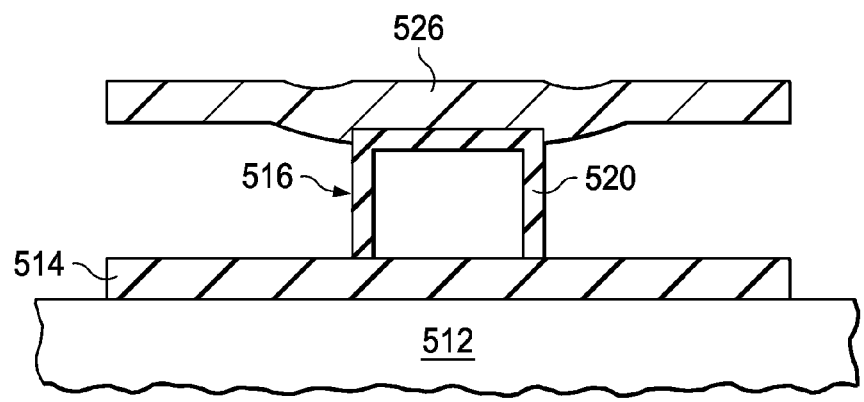

The dielectric microstructure as illustrated in FIG. 37 can be fabricated in many ways, one of which is diagrammatically illustrated in FIG. 40a through FIG. 40f. Referring to FIG. 40a, dielectric microstructure 516 is formed on element 514 by, for example, one of the methods described above or other methods. Dielectric microstructure 516 comprises resist mold 518 whose outer layer 520 is diffusion reactant (e.g. resulted from a diffusion process). Sacrificial planarizing layer 522 can be dispensed on element 514 and the dielectric structure, as diagrammatically illustrated in FIG. 40b. The sacrificial planarizing layer (522) can substantially completely cover the top surface of dielectric microstructure (516). The planarizing layer (522) may be a non-photoimageable polymer, or it may be photoimageable. The excess planarizing material of the sacrificial planarizing layer (522) can be removed from the top surface of the dielectric microstructure (522) by many possible ways. In one example wherein the sacrificial planarizing layer (522) is composed of a photoimageable material (e.g. a photoimageable polymer or photoresist), a hole that is larger than the top of the dielectric microstructure (516) is exposed and developed in the photoimageable polymer as shown in FIG. 40c. In order to planarize the developed surface of sacrificial planarizing layer 522, the photoimageable polymer is then thermally reflowed as diagrammatically illustrated in FIG. 40d. In another example wherein the sacrificial planarizing layer (522) is composed of a non-photoimageable material (e.g. non-photoimageable polymer), sacrificial planarizing layer (522) is plasma etched back so as to expose the top surface of dielectric microstructure (516) using a plasma ashing chemistry. Referring to FIG. 40e, top element 446 can be formed on the dielectric structure 516 and the sacrificial planarizing layer (522), by a suitable method, such as deposition/patterning. The sacrificial planarizing layer (522), as well as the sacrificial mold material (518 as illustrated in FIG. 40a) within the outer layer (520), can then be removed so as to form the desired dielectric microstructure (448) between the top and the bottom elements 446 and 514 as shown in FIG. 40f.

Figure 39A:
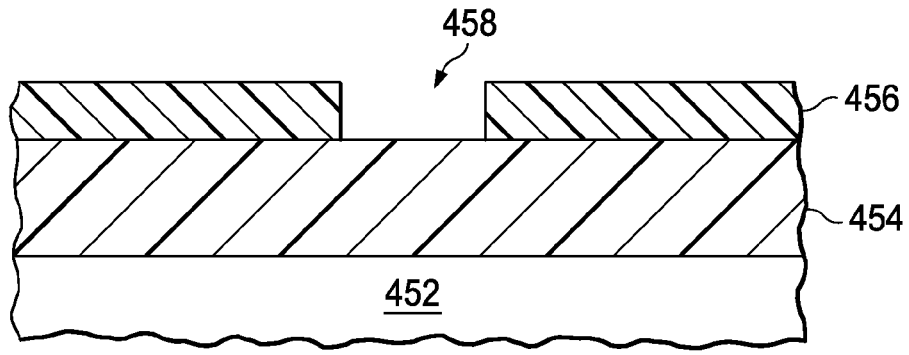
FIG. 39a through FIG. 39f schematically illustrates yet another exemplary method of making a dielectric microstructure.

The dielectric microstructure as discussed above with reference to FIG. 38 can be formed in many possible ways, one of which is diagrammatically illustrated in FIG. 39a through FIG. 39f. Referring to FIG. 39a, substrate 452 is provided followed by depositing mold layer 454 on substrate 452.

A top element (456) is formed on the mold layer (454). The top element (456) may be a metallic beam or an element composed of other desired materials, which is to be supported by a dielectric microstructure support. An opening (458) is formed in the top element (456), for example, by patterning the top element (456), at the desired location of the dielectric microstructure support to be formed.

Figure 39B:
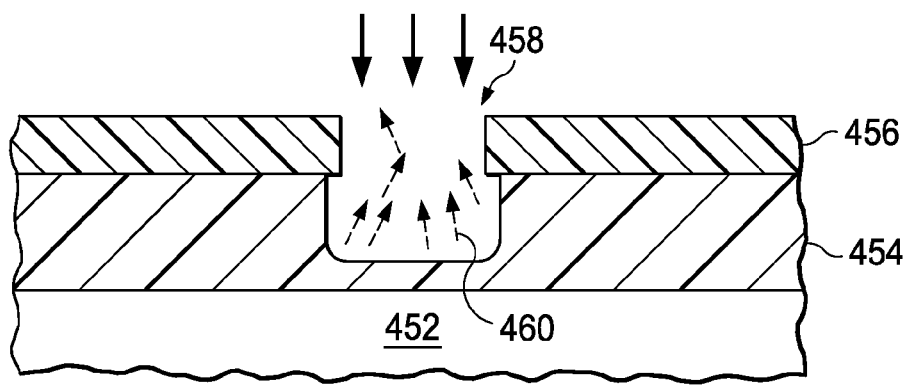
Figure 39C:
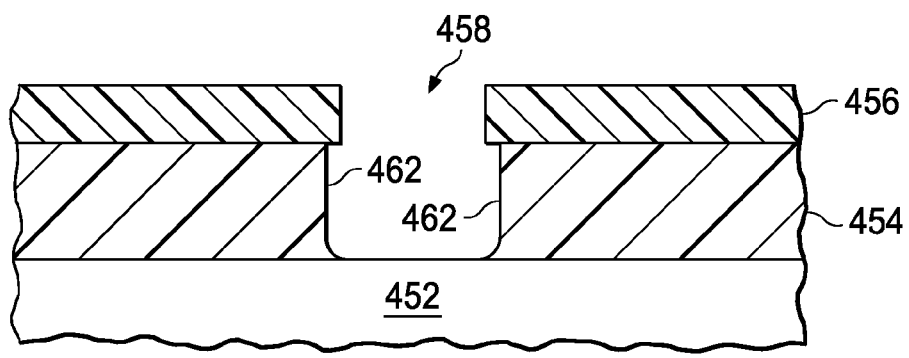

Referring to FIG. 39b, the opening (458) in top element (456) acts as an etch mask during an etch (e.g. an anisotropic plasma etch) of the exposed mold layer material 454 to form hole (460). Referring to FIG. 39c, the sidewalls (462) of hole (460) comprise the mold surface for the subsequent thermal diffusion step. If it is desirable to have a dielectric microstructure with more gently sloping sidewalls, an isotropic etch can be substituted for the anisotropic etch in this example.

Figure 39D:
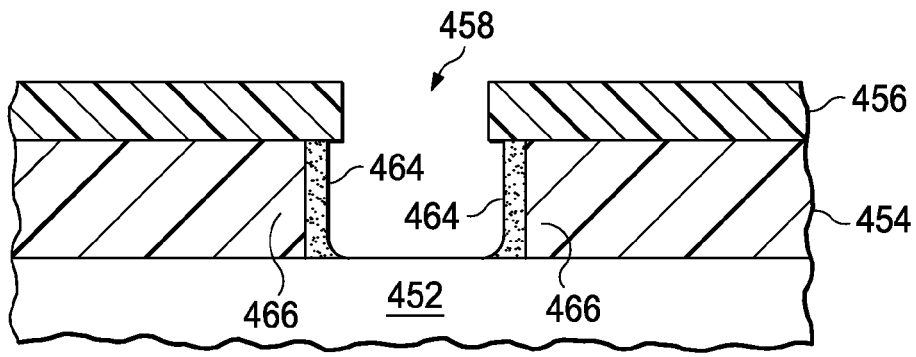

A thermal diffusion process, as well as an alternative step of removing excess reactant can be performed so as to convert the exposed sidewalls (462) of mold layer material (454) into a diffused outer portion, layer 464 and a non-diffused inner portion (466) as illustrated in FIG. 39d. Top element 456 acts to block the diffusion process outside the region of the mold surface sidewalls (462). The diffusion and/or the removal of excess reactant process can be the same as those discussed above with reference to FIG. 6 and FIG. 7, which will not be repeated herein. The converted outer layer of the mold surface sidewalls (462) is illustrated as element (464) in FIG. 39e.

Figure 39E:
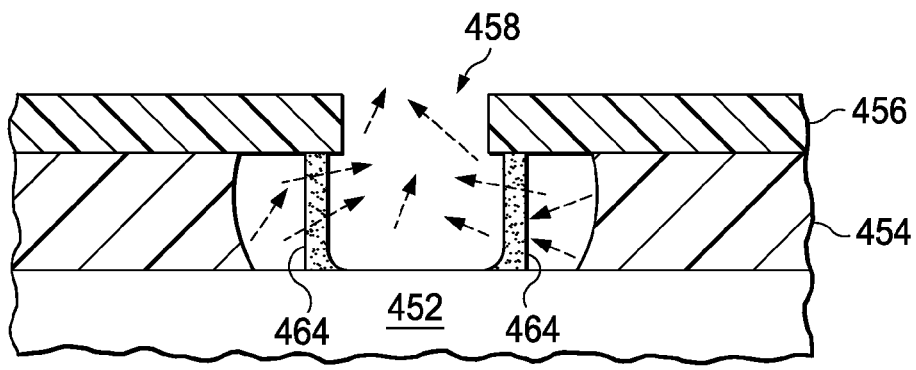
Figure 39F:
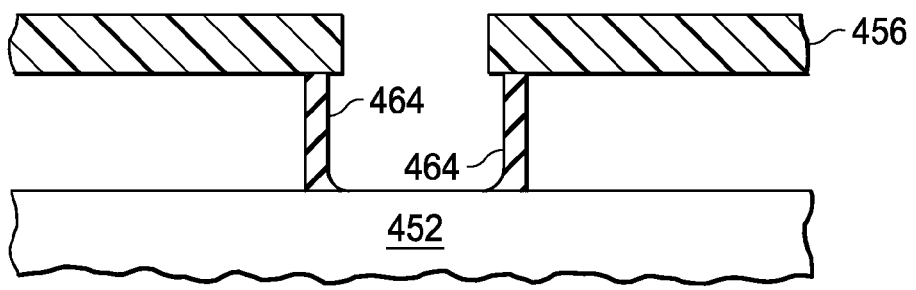

A plasma ashing process can be performed so as to remove the sacrificial mold materials in the non-diffused inner portion (466) of mold layer (454), as schematically illustrated in FIG. 39e. After removal of substantially all sacrificial mold materials, the desired dielectric microstructure support (464) is completed, as schematically illustrated in FIG. 39f.

The dielectric microstructure as discussed above has many applications, one of which is in micromirror devices. For demonstration purpose without losing generality, an exemplary micromirror device in prior art is schematically illustrated in FIG. 22.

Figure 22:
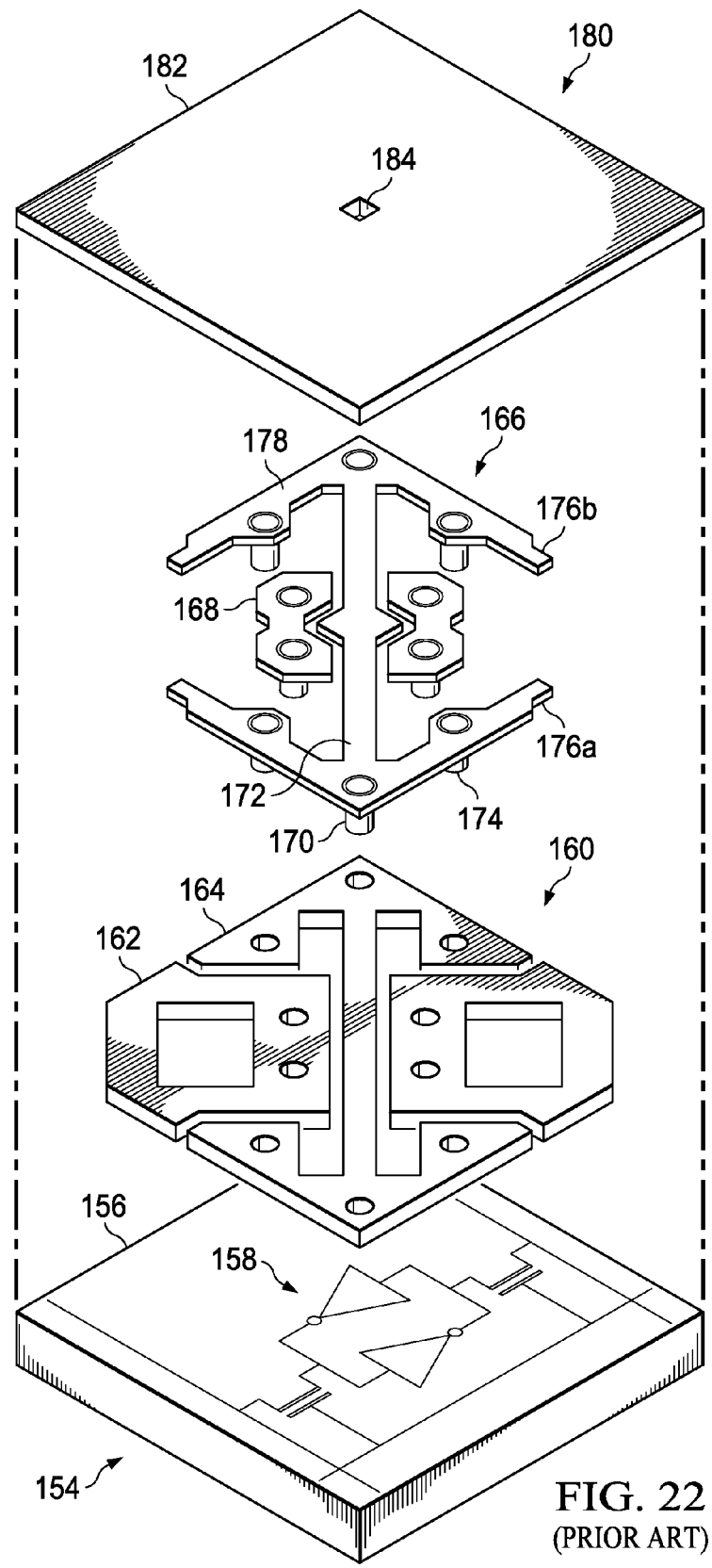
FIG. 22 schematically illustrates an existing micromirror device having spring stoppers.

Referring to FIG. 22, reflective mirror plate 182 of mirror plate layer 180 is attached to deformable hinge 172 of hinge layer 166 through mirror post 184 (hidden under the mirror plate). The deformable hinge (172) is held by hinge support 178; and the hinge support is held above hinge support pad 164 of addressing electrode layer 160 by hinge support posts (170) such that the deformable hinge is capable of deforming, which enables rotation of the mirror plate. For limiting the rotation of the mirror plate at desired rotational angles, stoppers 176a and 176b are provided; and each are supported by a stopper post, such as stopper post 174 above addressing electrode layer 160. The electrode layer (160) is formed on substrate 156 of substrate layer 154.

Rotation of the mirror plate is accomplished by addressing electrode pads (e.g. 162) on electrode pad layer 160 and elevated addressing electrodes (e.g. 168) on the hinge layer (166). During operation, an electrostatic field can be established between the mirror plate and the addressing electrode, as well as the elevated electrode. The electrostatic field results in electrostatic torque to the mirror plate. Under the electrostatic torque, the mirror plate rotates.

Rotation direction of the mirror plate can be controlled by applying electronic voltages to different electrode pads and addressing electrodes using electronic circuitry 158 that is formed on substrate 156 of substrate layer 154. The rotation angles of the mirror plate, thus the operational states of the micromirror device, are often controlled by stoppers that abut against the mirror plate when the mirror plate is rotated to the desired angles. In the example as shown in FIG. 22, multiple stoppers are employed for each rotation direction of the mirror plate. For example, stoppers 176a and 176b are formed in the deformable hinge layer for stopping the rotation of the mirror plate along one direction (e.g. clockwise rotation). At the desired rotation angle, the stoppers abut against the mirror plate to stop the rotation of the mirror plate and maintain the mirror plate at the desired rotation angle.

The multi-stopper for each rotation angle configuration, however, has disadvantages. For example, it limits scaling of the micromirror devices. As the micromirror device is scaled below, for example 10 microns, the electrostatic moment becomes too weak to sustain reliable operation because the multi-stoppers on either side of the rotation axis significantly reduce the available area for electrostatic fields. An approach to solve this problem is to expand the active area of the raised electrodes (e.g. raised electrode 168 in FIG. 22), as schematically illustrated the micromirror device in FIG. 23a.

Figure 23A:
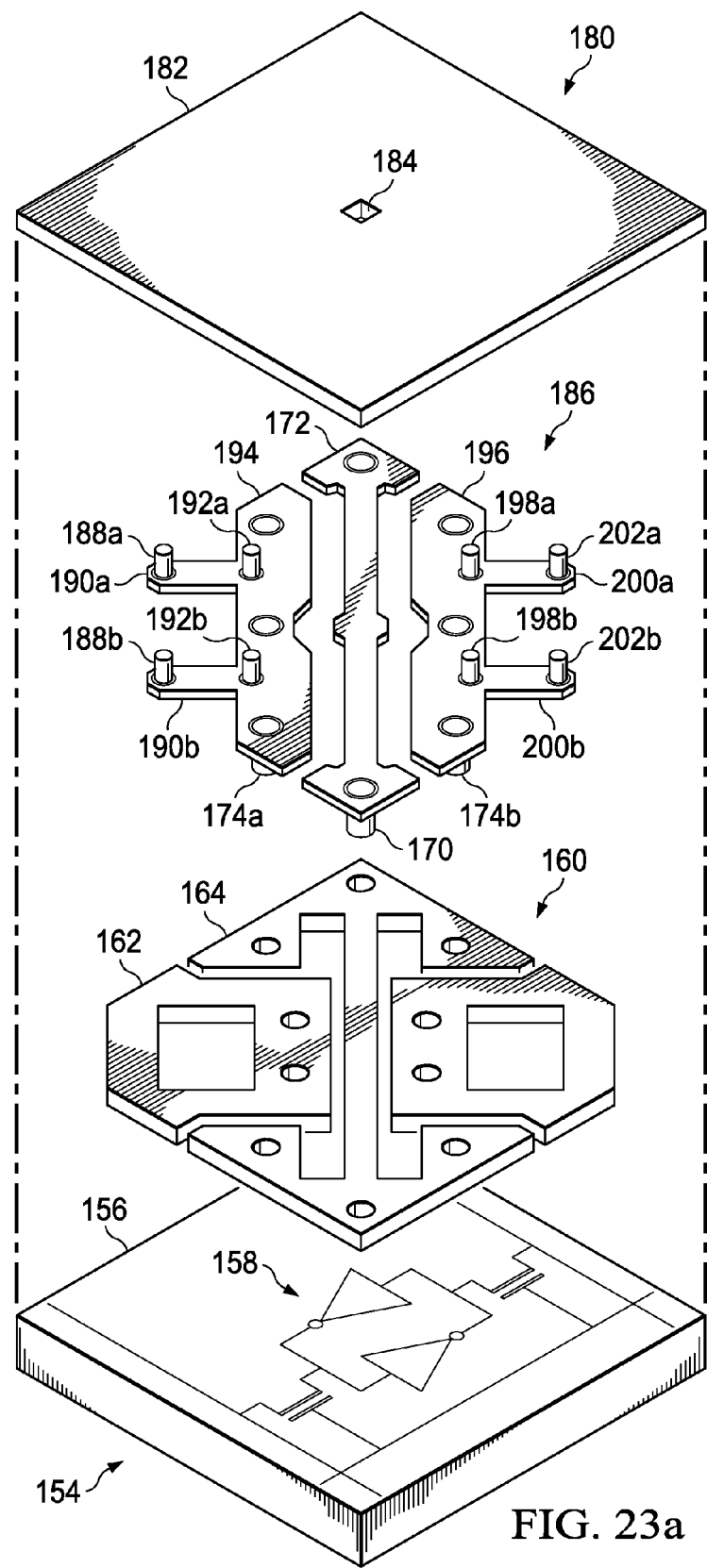
FIG. 23a schematically illustrates an exemplary micromirror device having a dielectric microstructure with unity-K formed on a spring stopper arm.

Referring to FIG. 23a and as compared to the micromirror device in FIG. 22, the hinge layer (166) of the micromirror device in FIG. 22 is replaced by hinge layer 186 in the micromirror device illustrated in FIG. 23a. In hinge layer 186, the raised electrodes (e.g. raised electrode 194 and 196) are expanded in the direction substantially parallel to the rotation axis of the mirror plate (182). The spring stoppers 190a, 190b, 200a, and 200b are incorporated into the expanded and raised electrodes. Specifically, each one of the raised electrodes 194 and 196 are expanded such that either edge of each one of the raised electrodes is substantially aligned to but not beyond the end of the above mirror plate. Spring stoppers 190a and 190b are incorporated into raised electrode 194 and each extend away in the direction substantially orthogonal to the length of the deformable hinge (172) and the rotation axis of the mirror plate (182). Spring stoppers 200a and 200b are incorporated into raised electrode 196 and each extend away in the direction substantially orthogonal to the length of the deformable hinge (172) and the rotation axis of mirror plate 182.

In order to prevent the mirror plate from electrical shorting to the spring stoppers that are physically connected to the raised electrodes, dielectric microstructures 188a, 188b, 202a, and 202b with substantially unity-K are formed on the spring stoppers 190a, 190b, 200a, and 200b and at locations between the mirror plate and the spring stoppers. Specifically, dielectric microstructures 188a and 188b each with unity-K are respectively formed on spring stoppers 190a and 190b so as to prevent electric shorting of the mirror plate (182) to the spring stoppers 190a and 190b. Dielectric microstructures 202a and 202b each with unity-K are respectively formed on spring stoppers 200a and 200b so as to prevent electric shorting of the mirror plate (182) to the spring stoppers 200a and 200b. Accordingly, it is preferred that the dielectric microstructures 188a, 188b, 202a, and 202b are formed at the farthest tips of the spring stoppers 190a, 190b, 200a, and 200b. The dielectric microstructures can be formed in other suitable locations on the spring stoppers so as to achieve desired rotational angles of the mirror plate.

Other than forming a single dielectric microstructure on each spring stopper, multiple dielectric microstructures with unity-K can be formed on each spring stopper. For example, dielectric microstructures 192a, 192b, 198a, and 198b can be respectively formed on spring stoppers 190a, 190b, 200a, and 200b so as to secure the electrical insulation between the mirror plate and the spring stoppers.

Figure 23B:
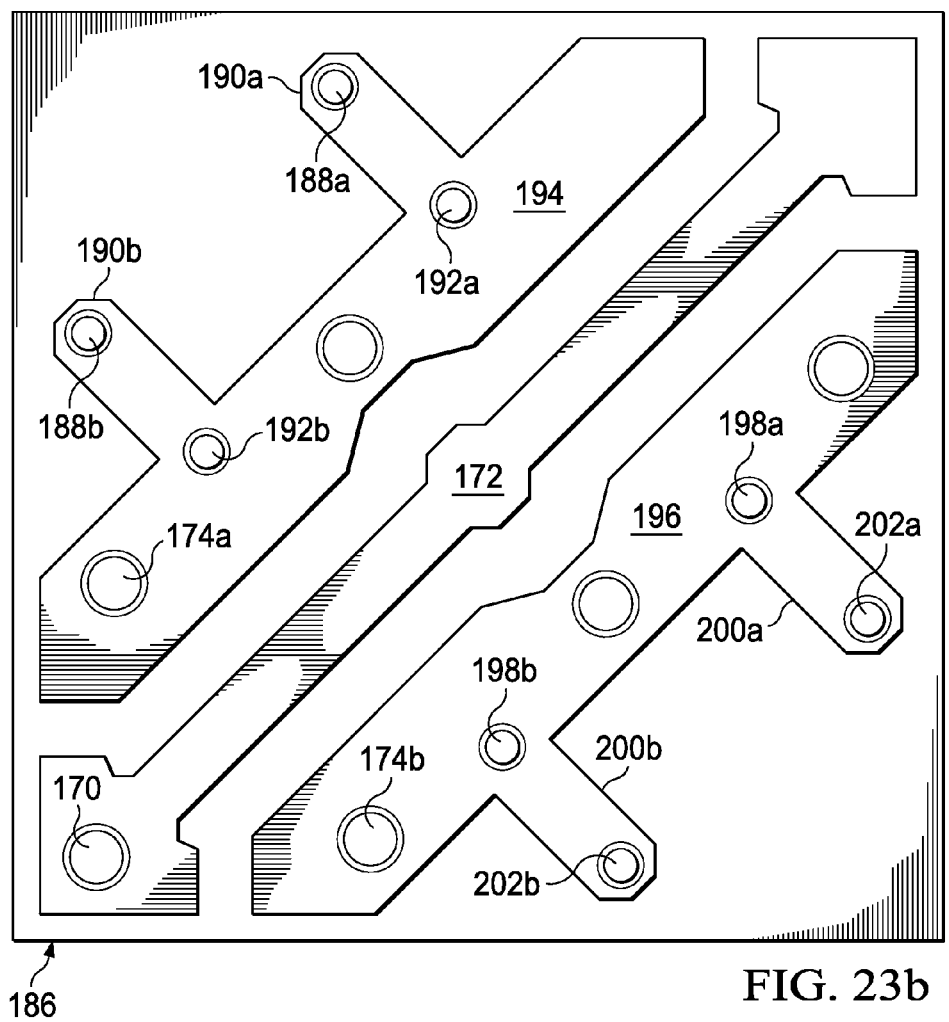

The hinge layer 186 of the micromirror device illustrated in FIG. 23a is better illustrated in a top view as illustrated in FIG. 23b. Referring to FIG. 23b, deformable hinge 172 is attached a hinge structure that is supported by hinge support posts (e.g. post 170). Expanded and raised electrodes 194 and 196 are supported above the electrode pad layer by posts, such as post 174a and 174b. Spring stoppers 190a and 190b are incorporated into electrode 194. Dielectric microstructures 188a and 192a are formed on spring stopper 190a, and dielectric microstructures 188b and 192b are formed on spring stopper 190b. Spring stoppers 200a and 200b are incorporated into electrode 196. Dielectric microstructures 202a and 198a are formed on spring stopper 200a, and dielectric microstructures 202b and 198b are formed on spring stopper 200b.

Because the dielectric microstructures are formed on the spring stoppers and each have a substantially unit dielectric constant K, an electrical field between the mirror plate and an expanded raised electrode is substantially the same as the electrical field that would have existed in the absence of the dielectric microstructure. This effect is better illustrated by examining a close-up of the region of interest shown in FIG. 2l and FIG. 2m.

Figure 24:
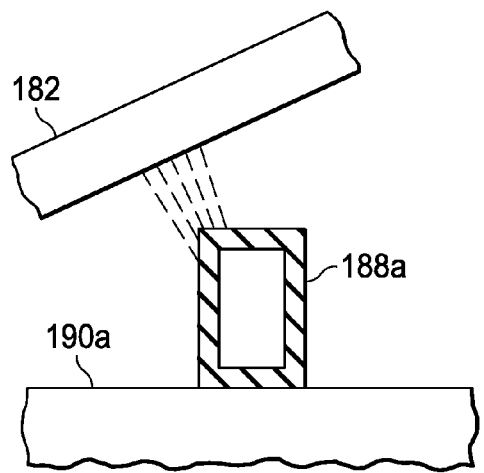
FIG. 24 schematically illustrates a cross-sectional view of the dielectric microstructure of the micromirror device in FIG. 23a in an electric field.

Referring to FIG. 24, mirror plate 182 is approaching spring stopper 190a having formed thereon dielectric microstructure 188a; and just about before contacting dielectric microstructure 188a. Because the dielectric microstructure (188a) has substantially unity-K, dielectric microstructure 188a is substantially transparent to the electric field that is established between the mirror plate and the raised electrode (194) to which spring stopper 190a is incorporated. As modeled in FIG. 2m, the field lines from the mirror plate (or the raised electrode) to the raised electrode (or the mirror plate) passing through the thin side walls of dielectric microstructure 188a such that the electric field is not terminated or dropped by the presence of dielectric microstructure 188a.

At the desired angle, the mirror plate (182) is stopped by contacting against dielectric microstructure 188a. Because microstructure is a dielectric material (188a), electric connections between the mirror plate and the spring stopper are prevented, and thus, the electrical shorting of the mirror plate to the raised and expanded electrode is prevented.

As discussed before, the dielectric microstructure may comprise any suitable dielectric materials. In examples of micromirrors, such as that illustrated in FIG. 23a through FIG. 24, it is preferred that the dielectric microstructures each comprise porous $Al_2O_3$ due to its many advantages. In one example, because the side walls of the dielectric microstructure can be 3-10 nm thick, it is of great importance that the material used to form the side walls of the dielectric microstructure be inert to the sacrificial spacer ashing. The ashing contains both O and F free radicals, neither one etching aluminum oxide. On the other hand, if the dielectric microstructure is made of $SiO_2$, it would be completely removed during the ashing process.

In another example, carboxylic acids can be used to passivate/lubricante the contacting surfaces of the micromirror device. These acids react with aluminum oxide to form carboxylate bonds, ensuring a more stable structure with greater wear resistance.

In yet another example, porosity of the outer shell of the dielectric microstructure ensures that the passivant can be distributed throughout the bulk of the dielectric microstructure, so that a supply of passivant can be available locally to repair damage at contact sites by diffusive transport through the porous side walls of the dielectric microstructure.

In another example, because the dielectric microstructure each can be both porous and hollow, relubrication by direct vapor transportation from the headspace occurs in all directions about the contact sites.

The micromirror device as discussed above with reference to FIG. 23a has many applications, one of which is a spatial light modulator for use in an imaging system, such as rear-projection systems and front-projection systems. An exemplary display system is schematically illustrated in FIG. 25.

Figure 25:
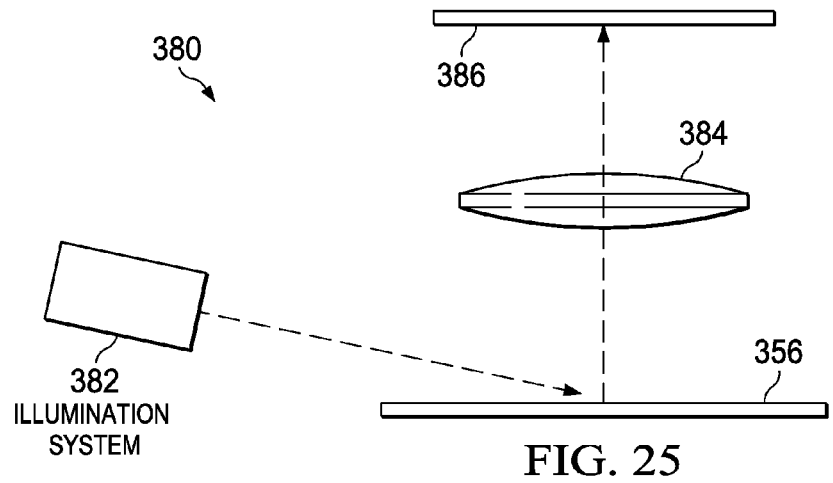

Referring to FIG. 25, imaging system comprises illumination system 382, spatial light modulator 356, and alternative features of projection optics 384, and screen 386. The illumination system provides illumination light that travels towards the spatial light modulator. The spatial light modulator comprises n×m micromirror devices (referred to as resolution) with n being the number of rows and m being the number of columns; and each micromirror being the micromirror as discussed above with reference to FIG. 23a. As an example, the spatial light modulator may have a resolution of 640×480 (VGA) or higher, such as 800×600 (SVGA) or higher, 1024× 768 (XGA) or higher, 1280×1024 (SXGA) or higher, 1280× 720 or higher, 1400×1050 or higher, 1600×1200 (UXGA) or higher, and 1920×1080 or higher, or integer multiples and fractions of these resolutions. Of course, other resolutions are also applicable. Each micromirror device can have a characteristic dimension of 100 microns or less, such as 20 microns or less, and 10 microns or less. The smallest distance between the adjacent micromirror devices is referred to as gap, which can be 5 microns or less, 2 microns or less, and 1 micron or less.

The spatial light modulator modulates the incident illumination light based on image data, such as bitplane data, derived from desired images to be produced. The modulated light is directed to the screen through projection optics 384 so as to form the desired image on the screen.

Figure 31A:
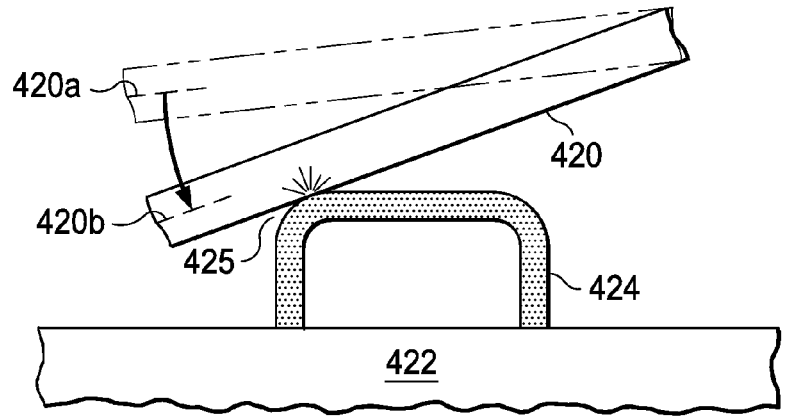
FIG. 31a diagrammatically illustrates an exemplary application of an exemplary dielectric of this disclosure.

Unity-K dielectric microstructures as discussed above can be implemented in other applications. In one example as diagrammatically illustrated in FIG. 31a, a dielectric microstructure (424) with substantially unity-K can be used as a motion stopper, for example, formed on a substrate (422) for limiting the motion of a movable element (420) between e.g.

a non-contact position (420a) and a contacting position (420b). At the contacting position 420b, movable element physically contacts the unity-K dielectric microstructure at contact point 425. A particular example of such a motion stopping application is in a micromirror device, as discussed above with reference to FIG. 23 through FIG. 25; which will not be repeated herein.

Figure 31B:
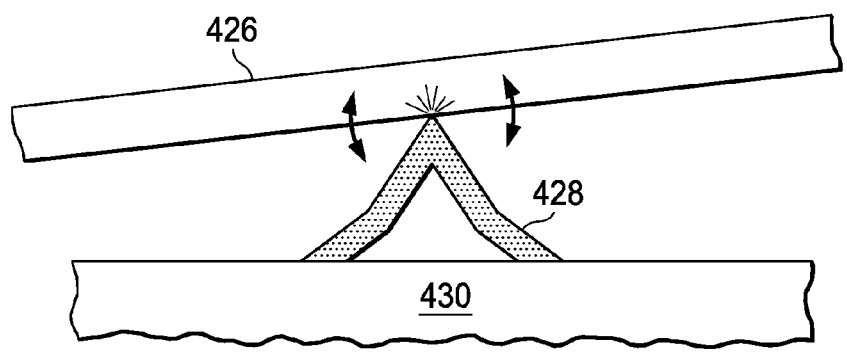
FIG. 31b diagrammatically illustrates another exemplary application of another exemplary dielectric of this disclosure.
Figure 31C:
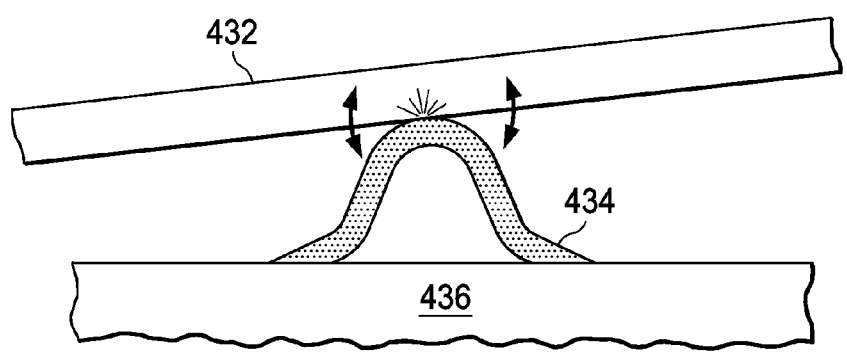
FIG. 31c diagrammatically illustrates yet another exemplary application of yet another exemplary dielectric of this disclosure.

A dielectric microstructure with substantially unity-K disclosed herein can also be used as a fulcrum in a microstructure, an example of which is diagrammatically illustrated in FIG. 31b. In this example, fulcrum 428 is configured as a dielectric microstructure with substantially unity-K; and has a sharp tip for guiding the motion of movable element 426 above element 430 in a microstructure device. Other than a sharp tip, the fulcrum can be configured to have a curved peak as diagrammatically illustrated in FIG. 31c.

Figure 31D:
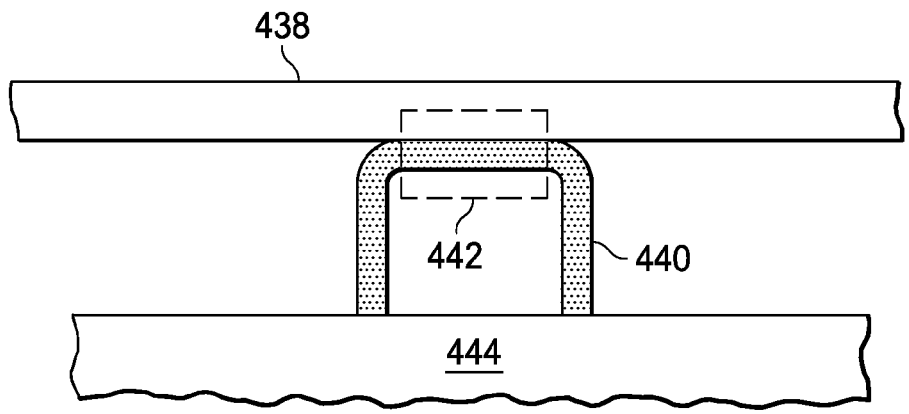
FIG. 31d diagrammatically illustrates yet another exemplary application of yet another exemplary dielectric of this disclosure.

In another example as diagrammatically illustrated in FIG. 31d, the dielectric microstructure with substantially unity-K can be used as a low thermal-conductance structural support for microbolometers. In addition to the unity-K benefits, the dielectric microstructure provides high thermal isolation (low thermal conductance) due the small cross-sectional area of the dielectric walls. In this example, a mechanical/electrical element (438) of the microbolometer is supported above substrate (444) by physical attachment to the top of a dielectric microstructure (440) in the region (442). Because of the low thermal conductance of dielectric microstructure (440), mechanical/electrical element (438) is thermally isolated, yet physically supported relative to substrate (444). The dielectric microstructure (440) used as a structural support as diagrammatically illustrated in FIG. 31d can be fabricated in a variety of ways including the fabrication processes detailed with reference to FIG. 37 and FIG. 38.

It will be appreciated by those of ordinary skill in the art that new and useful dielectric microstructures with a unit dielectric constant K~1.0 and methods of making the same have been described herein. In view of the many possible embodiments, however, it should be recognized that the embodiments described herein with respect to the drawing figures are meant to be illustrative only and should not be taken as limiting the scope of what is claimed. Those of ordinary skill in the art will recognize that the illustrated embodiments can be modified in arrangement and detail. Therefore, the devices and methods as described herein contemplate all such embodiments as may come within the scope of the following claims and equivalents thereof.

What is claimed is:

1. A microelectromechanical system (MEMS) device, comprising:
   a bottom electrode;
   a top electrode supported for movement relative to the bottom electrode;
   a dielectric microstructure disposed between the top and bottom electrodes; the dielectric microstructure having a substantially unitary dielectric constant K in electric fields, and being dimensioned and configured as a motion stopper for the relative movement.

2. The device of claim 1, wherein the dielectric microstructure comprises a hollow, gas filled structure formed on one of the top and bottom electrodes.

3. The device of claim 2, wherein the dielectric microstructure comprises an air-filled cavity of a hollow shell formed on the bottom electrode.

4. The device of claim 3, wherein the dielectric microstructure is formed on the bottom electrode such that a bottom of the air-filled cavity is defined by a portion of a top surface of the bottom electrode.

5. The device of claim 4, wherein the top electrode comprises a mirror of a digital micromirror device (DMD) and the bottom electrode comprises a raised electrode of the digital micromirror device.

6. The device of claim 3, wherein the shell comprises at least one of a nitride, an oxide or an oxynitride.

7. The device of claim 3, wherein the shell comprises a porous mixture comprising $Al_2O_3$ or an aluminum organometallic compound or $SiO_2$ or a silicon organometallic compound.

8. The device of claim 6, wherein the shell comprises at least one of $Al_2O_3$, $Si_3N_4$ or $SiO_2$.

9. The device of claim 8, wherein the shell comprises porous $Al_2O_3$.

10. The device of claim 8, wherein the hollow shell has a wall thickness of 3-10 nm.

11. The device of claim 10, wherein the top electrode comprises a mirror of a digital micromirror device (DMD) and the bottom electrode comprises a raised electrode of the digital micromirror device.

12. The device of claim 1, wherein the top electrode comprises a mirror of a digital micromirror device (DMD) and the bottom electrode comprises a raised electrode of the digital micromirror device.

13. The device of claim 1, wherein the dielectric microstructure comprises at least one of a nitride, an oxide or an oxynitride.

14. The device of claim 1, wherein the dielectric microstructure comprises at least one of $Al_2O_3$, $Si_3N_4$ or $SiO_2$.

15. The device of claim 1, wherein the dielectric microstructure comprises a hollow shell formed on a portion of a top surface of the bottom electrode, the shell and top surface of the bottom electrode defining a gas-filled cavity.

16. The device of claim 15, wherein the hollow shell has a wall thickness of 3-10 nm.

17. The device of claim 15, wherein the hollow shell comprises porous aluminum oxide material 18. The device of claim 1, wherein the dielectric microstructure comprises a hollow shell having a wall thickness of 3-10 nm.

19. The device of claim 1, wherein the dielectric microstructure is formed on the bottom electrode such that a gas-filled cavity is defined with a portion of a top surface of the bottom electrode.

20. A microelectromechanical system (MEMS) device, comprising:
    an electrode;
    a micromirror supported for rotation movement relative to the electrode in response to application of electric fields;
    a dielectric microstructure comprising a hollow dielectric shell disposed between the electrode and the mirror; the dielectric microstructure having a substantially unitary dielectric constant K in electric fields, and being dimensioned and configured as a motion stopper for the relative rotation movement.

21. The device of claim 20, wherein the shell is formed on the electrode.

22. The device of claim 21, wherein an interior of the shell and a portion of a top surface of the electrode define a gas-filled cavity.

23. The device of claim 22, wherein the shell has walls comprising at least one of a nitride, an oxide or an oxynitride.

24. The device of claim 23, wherein the walls comprise aluminum oxide.

25. The device of claim 24, wherein the walls have a thickness of 3-10 nm.

26. The device of claim 20, wherein the hollow dielectric shell has walls with a thickness of 10 nm or less comprised of at least one of a nitride, an oxide or an oxynitride.

* * * * *